US008444309B2

(12) United States Patent
Jansen et al.

(10) Patent No.: US 8,444,309 B2
(45) Date of Patent: May 21, 2013

(54) WIRING DEVICE WITH ILLUMINATION

(75) Inventors: Ronald Jansen, Ridgewood, NY (US); Michael Kamor, North Massapequa, NY (US); Adam Kevelos, Plainview, NY (US); Walter Ancipiuk, Staten Island, NY (US)

(73) Assignee: Leviton Manufacturing Company, Inc., Melville, NY (US)

( * ) Notice: Subject to any disclaimer, the term of this patent is extended or adjusted under 35 U.S.C. 154(b) by 331 days.

(21) Appl. No.: 12/856,387

(22) Filed: Aug. 13, 2010

(65) Prior Publication Data

US 2012/0039086 A1 Feb. 16, 2012

(51) Int. Cl.
*F21V 33/00* (2006.01)
*F21V 7/04* (2006.01)
*H01L 33/00* (2010.01)

(52) U.S. Cl.
USPC .............. 362/555; 362/551; 362/554; 362/95

(58) Field of Classification Search
None
See application file for complete search history.

(56) References Cited

U.S. PATENT DOCUMENTS

| | | | |
|---|---|---|---|
| D65,877 | S | 10/1924 | Vandergaw et al. |
| 1,875,224 | A | 7/1932 | Despard |
| RE19,092 | E | 2/1934 | Despard |
| 2,134,696 | A | 11/1938 | Bigman |
| 2,154,160 | A | 4/1939 | Hamilton |
| 2,189,676 | A | 2/1940 | Pfohl |
| 2,246,613 | A | 6/1941 | Bigman |
| 2,434,065 | A | 1/1948 | Courtney |
| 2,494,560 | A | 1/1950 | Kaupp |
| 2,512,975 | A | 6/1950 | Sherrard |
| 2,540,496 | A | 2/1951 | Sperrazza |
| 2,612,597 | A | 9/1952 | Sherrard |
| 2,740,873 | A | 4/1956 | Cronk |
| 2,752,581 | A | 6/1956 | Benander |
| 2,826,652 | A | 3/1958 | Piplack |
| 2,926,327 | A | 2/1960 | Metelli |
| 3,204,807 | A | 9/1965 | Ramsing |
| 3,222,631 | A | 12/1965 | Cohen |
| 3,238,492 | A | 3/1966 | Houston |
| 3,265,888 | A | 8/1966 | Adolphson, Jr. |
| 3,309,571 | A | 3/1967 | Gilker |
| D210,590 | S | 3/1968 | Edmisson |
| 3,435,169 | A | 3/1969 | Bienwald |

(Continued)

FOREIGN PATENT DOCUMENTS

| | | |
|---|---|---|
| AU | 759587 | 7/2003 |
| AU | 775072 | 10/2004 |

(Continued)

OTHER PUBLICATIONS

Catalog: *L-100 Leviton Wiring Device Catalog*; (date: Jan. 30, 2006); 25 pages.

(Continued)

*Primary Examiner* — Natalie Walford
(74) *Attorney, Agent, or Firm* — Collard & Roe, P.C.

(57) ABSTRACT

One embodiment of the invention relates to an electrical device having illumination comprising a housing and at least one light pipe extending along a longitudinal axis, inside the housing. There is at least one light disposed in the housing and being positioned adjacent to the light pipe. The light has a radiation pattern having a corresponding peak radiation pattern direction which extends along the longitudinal axis of the light pipe.

42 Claims, 26 Drawing Sheets

U.S. PATENT DOCUMENTS

| | | | |
|---|---|---|---|
| 3,538,477 | A | 11/1970 | Walters et al. |
| D220,795 | S | 5/1971 | Slater |
| 3,588,489 | A | 6/1971 | Gaines |
| 3,617,662 | A | 11/1971 | Miller |
| 3,702,418 | A | 11/1972 | Obenhaus |
| 3,731,154 | A | 5/1973 | Torosian |
| 3,739,226 | A | 6/1973 | Seiter et al. |
| 3,746,877 | A | 7/1973 | Seiter et al. |
| 3,766,434 | A | 10/1973 | Sherman |
| 3,775,726 | A | 11/1973 | Gress |
| 3,813,579 | A | 5/1974 | Doyle et al. |
| 3,864,649 | A | 2/1975 | Doyle |
| 3,872,354 | A | 3/1975 | Nestor et al. |
| 3,895,225 | A | 7/1975 | Prior |
| 3,949,336 | A | 4/1976 | Dietz |
| 3,986,763 | A | 10/1976 | Sparrow |
| 3,990,758 | A | 11/1976 | Petterson |
| 4,002,951 | A | 1/1977 | Halbeck |
| 4,010,431 | A | 3/1977 | Virani et al. |
| 4,010,432 | A | 3/1977 | Klein et al. |
| 4,013,929 | A | 3/1977 | Dietz et al. |
| 4,034,266 | A | 7/1977 | Virani et al. |
| 4,034,360 | A | 7/1977 | Schweitzer, Jr. |
| 4,051,544 | A | 9/1977 | Vibert |
| 4,063,299 | A | 12/1977 | Munroe |
| 4,072,382 | A | 2/1978 | Reschke |
| 4,086,549 | A | 4/1978 | Slater et al. |
| 4,109,226 | A | 8/1978 | Bowling et al. |
| 4,114,123 | A | 9/1978 | Grenier |
| 4,148,536 | A | 4/1979 | Petropoulsos et al. |
| 4,159,499 | A | 6/1979 | Bereskin |
| 4,163,882 | A | 8/1979 | Baslow |
| 4,168,104 | A | 9/1979 | Buschow |
| 4,194,231 | A | 3/1980 | Klein |
| 4,223,365 | A | 9/1980 | Moran |
| 4,237,435 | A | 12/1980 | Cooper et al. |
| 4,271,337 | A | 6/1981 | Barkas |
| 4,288,768 | A | 9/1981 | Arnhold et al. |
| 4,316,230 | A | 2/1982 | Hansen et al. |
| 4,377,837 | A | 3/1983 | Matsko et al. |
| 4,379,607 | A | 4/1983 | Bowden, Jr. |
| 4,386,338 | A | 5/1983 | Doyle et al. |
| D269,431 | S | 6/1983 | Doyle et al. |
| 4,409,574 | A | 10/1983 | Misencik et al. |
| 4,412,193 | A | 10/1983 | Bienwald et al. |
| 4,418,979 | A | 12/1983 | Takashima |
| 4,442,470 | A | 4/1984 | Misencik |
| 4,514,789 | A | 4/1985 | Jester |
| 4,515,945 | A | 5/1985 | Ranken et al. |
| 4,518,945 | A | 5/1985 | Doyle et al. |
| 4,521,824 | A | 6/1985 | Morris et al. |
| 4,522,455 | A | 6/1985 | Johnson |
| 4,538,040 | A | 8/1985 | Ronemus et al. |
| 4,544,219 | A | 10/1985 | Barkas |
| 4,546,419 | A | 10/1985 | Johnson |
| 4,567,456 | A | 1/1986 | Legatti |
| 4,568,899 | A | 2/1986 | May et al. |
| 4,574,260 | A | 3/1986 | Franks |
| 4,578,732 | A | 3/1986 | Draper et al. |
| 4,587,588 | A | 5/1986 | Goldstein |
| 4,595,894 | A | 6/1986 | Doyle et al. |
| 4,603,932 | A | 8/1986 | Heverly |
| 4,630,015 | A | 12/1986 | Gernhardt et al. |
| 4,631,624 | A | 12/1986 | Dvorak et al. |
| 4,641,216 | A | 2/1987 | Morris et al. |
| 4,641,217 | A | 2/1987 | Morris et al. |
| 4,667,073 | A | 5/1987 | Osika |
| 4,686,600 | A | 8/1987 | Morris et al. |
| 4,714,858 | A | 12/1987 | Sanders |
| 4,719,437 | A | 1/1988 | Yun |
| 4,722,693 | A | 2/1988 | Rose |
| 4,755,913 | A | 7/1988 | Sleveland |
| 4,774,641 | A | 9/1988 | Rice |
| 4,802,052 | A | 1/1989 | Brant et al. |
| 4,814,641 | A | 3/1989 | Dufresne |
| 4,816,957 | A | 3/1989 | Irwin |
| 4,855,719 | A | 8/1989 | Posey |
| 4,867,693 | A | 9/1989 | Gizienski et al. |
| 4,867,694 | A | 9/1989 | Short |
| 4,897,049 | A | 1/1990 | Miller et al. |
| 4,901,183 | A | 2/1990 | Lee |
| 4,936,789 | A | 6/1990 | Ugalde |
| 4,949,070 | A | 8/1990 | Wetzel |
| 4,967,308 | A | 10/1990 | Morse |
| 4,979,070 | A | 12/1990 | Bodkin |
| 5,006,075 | A | 4/1991 | Bowden, Jr. |
| 5,020,997 | A | 6/1991 | Calderara et al. |
| 5,069,630 | A | 12/1991 | Tseng et al. |
| 5,117,334 | A | 5/1992 | Kameda |
| 5,144,516 | A | 9/1992 | Sham |
| 5,146,385 | A | 9/1992 | Misencik |
| 5,148,344 | A | 9/1992 | Rao et al. |
| 5,161,240 | A | 11/1992 | Johnson |
| 5,179,491 | A | 1/1993 | Runyan |
| 5,185,687 | A | 2/1993 | Beihoff et al. |
| 5,202,662 | A | 4/1993 | Bienwald et al. |
| 5,218,331 | A | 6/1993 | Morris et al. |
| 5,223,810 | A | 6/1993 | Van Haaren |
| 5,224,006 | A | 6/1993 | MacKenzie et al. |
| 5,229,730 | A | 7/1993 | Legatti et al. |
| 5,239,438 | A | 8/1993 | Echtler |
| D342,581 | S | 12/1993 | Reynolds |
| 5,277,607 | A | 1/1994 | Thumma et al. |
| 5,277,620 | A | 1/1994 | Taylor |
| 5,293,522 | A | 3/1994 | Fello et al. |
| 5,320,545 | A | 6/1994 | Brothers |
| 5,347,248 | A | 9/1994 | Herbert |
| 5,363,269 | A | 11/1994 | McDonald |
| 5,374,199 | A | 12/1994 | Chung |
| 5,391,085 | A | 2/1995 | Tigner |
| 5,413,501 | A | 5/1995 | Munn |
| 5,418,678 | A | 5/1995 | McDonald |
| D359,346 | S | 6/1995 | Martin |
| 5,448,443 | A | 9/1995 | Muelleman |
| 5,473,517 | A | 12/1995 | Blackman |
| 5,477,412 | A | 12/1995 | Neiger et al. |
| D366,339 | S | 1/1996 | Waller |
| 5,485,356 | A | 1/1996 | Nguyen |
| 5,510,760 | A | 4/1996 | Marcou et al. |
| 5,515,218 | A | 5/1996 | DeHaven |
| 5,517,165 | A | 5/1996 | Cook |
| 5,518,132 | A | 5/1996 | Chen |
| 5,541,800 | A | 7/1996 | Misencik |
| 5,551,884 | A | 9/1996 | Burkhart, Sr. |
| 5,555,150 | A | 9/1996 | Newman, Jr. |
| 5,576,580 | A | 11/1996 | Hosoda et al. |
| 5,586,879 | A | 12/1996 | Szpak |
| 5,594,398 | A | 1/1997 | Marcou et al. |
| 5,600,524 | A | 2/1997 | Neiger et al. |
| 5,617,284 | A | 4/1997 | Paradise |
| 5,625,285 | A | 4/1997 | Virgilio |
| 5,628,394 | A | 5/1997 | Benke et al. |
| 5,631,798 | A | 5/1997 | Seymour et al. |
| 5,637,000 | A | 6/1997 | Osterbrock et al. |
| 5,654,857 | A | 8/1997 | Gershen |
| 5,655,648 | A | 8/1997 | Rosen et al. |
| 5,660,459 | A | 8/1997 | Appelberg |
| 5,661,623 | A | 8/1997 | McDonald et al. |
| 5,665,648 | A | 9/1997 | Little |
| 5,680,287 | A | 10/1997 | Gernhardt et al. |
| 5,683,166 | A | 11/1997 | Lutzker |
| 5,694,280 | A | 12/1997 | Zhou |
| 5,696,350 | A | 12/1997 | Anker |
| 5,702,259 | A | 12/1997 | Lee |
| 5,706,155 | A | 1/1998 | Neiger et al. |
| 5,710,399 | A | 1/1998 | Castonguay et al. |
| 5,715,125 | A | 2/1998 | Neiger et al. |
| 5,719,363 | A | 2/1998 | Handler |
| 5,729,417 | A | 3/1998 | Neiger et al. |
| D397,812 | S | 9/1998 | Schifrin |
| 5,805,397 | A | 9/1998 | MacKenzie |
| 5,815,363 | A | 9/1998 | Chu |
| 5,825,602 | A | 10/1998 | Tosaka et al. |
| 5,833,350 | A | 11/1998 | Moreland |
| 5,839,909 | A | 11/1998 | Calderara et al. |
| 5,844,765 | A | 12/1998 | Kato et al. |
| 5,846,092 | A | 12/1998 | Feldman et al. |

| | | | |
|---|---|---|---|
| 5,847,913 | A | 12/1998 | Turner et al. |
| 5,849,878 | A | 12/1998 | Cantor et al. |
| 5,875,087 | A | 2/1999 | Spencer et al. |
| 5,877,925 | A | 3/1999 | Singer |
| 5,883,445 | A | 3/1999 | Holman |
| 5,902,140 | A | 5/1999 | Cheung et al. |
| 5,915,981 | A | 6/1999 | Mehta |
| 5,917,686 | A | 6/1999 | Chan et al. |
| 5,920,451 | A | 7/1999 | Fasano et al. |
| 5,933,063 | A | 8/1999 | Keung et al. |
| 5,934,451 | A | 8/1999 | Yu et al. |
| 5,943,198 | A | 8/1999 | Hirsh et al. |
| 5,943,199 | A | 8/1999 | Aromin |
| D413,862 | S | 9/1999 | Huang et al. |
| 5,956,218 | A | 9/1999 | Berthold |
| 5,963,408 | A | 10/1999 | Neiger et al. |
| 6,000,807 | A | 12/1999 | Moreland |
| 6,005,189 | A | 12/1999 | Anker |
| 6,021,034 | A | 2/2000 | Chan et al. |
| 6,040,967 | A | 3/2000 | DiSalvo |
| 6,045,232 | A | 4/2000 | Buckmaster |
| 6,052,265 | A | 4/2000 | Zaretsky et al. |
| 6,078,113 | A | 6/2000 | True et al. |
| D427,887 | S | 7/2000 | Leopold et al. |
| 6,086,391 | A | 7/2000 | Chiu |
| 6,089,893 | A | 7/2000 | Yu et al. |
| 6,109,760 | A | 8/2000 | Salatrik et al. |
| 6,111,210 | A | 8/2000 | Allison |
| 6,149,446 | A | 11/2000 | Yu |
| 6,180,899 | B1 | 1/2001 | Passow |
| 6,204,743 | B1 | 3/2001 | Greenberg et al. |
| 6,217,353 | B1 | 4/2001 | Yu-Tse |
| 6,224,401 | B1 | 5/2001 | Yu |
| 6,226,161 | B1 | 5/2001 | Neiger et al. |
| 6,232,857 | B1 | 5/2001 | Mason, Jr. et al. |
| 6,238,224 | B1 | 5/2001 | Shao |
| 6,242,993 | B1 | 6/2001 | Fleege et al. |
| 6,246,558 | B1 | 6/2001 | DiSalvo et al. |
| 6,252,407 | B1 | 6/2001 | Gershen |
| 6,255,923 | B1 | 7/2001 | Mason, Jr. et al. |
| 6,259,340 | B1 | 7/2001 | Fuhr et al. |
| 6,282,070 | B1 | 8/2001 | Ziegler et al. |
| 6,288,882 | B1 | 9/2001 | DiSalvo et al. |
| 6,290,533 | B1 | 9/2001 | Major |
| 6,299,487 | B1 | 10/2001 | Lopata et al. |
| 6,309,248 | B1 | 10/2001 | King |
| 6,324,043 | B1 | 11/2001 | Turner |
| 6,334,787 | B1 | 1/2002 | Chang |
| 6,350,039 | B1 | 2/2002 | Lee |
| 6,381,112 | B1 | 4/2002 | DiSalvo |
| 6,381,113 | B1 | 4/2002 | Legatti |
| 6,386,725 | B1 | 5/2002 | Amburgey |
| 6,412,941 | B1 | 7/2002 | Xiao |
| 6,421,941 | B1 | 7/2002 | Finke et al. |
| 6,422,880 | B1 | 7/2002 | Chiu |
| 6,433,555 | B1 | 8/2002 | Leopold et al. |
| 6,437,700 | B1 | 8/2002 | Herzfeld et al. |
| 6,437,953 | B2 | 8/2002 | DiSalvo et al. |
| D462,660 | S | 9/2002 | Huang et al. |
| D468,033 | S | 12/2002 | Warren et al. |
| 6,488,529 | B1 | 12/2002 | Chen |
| 6,537,088 | B2 | 3/2003 | Huang |
| 6,537,089 | B1 | 3/2003 | Montague |
| 6,545,574 | B1 | 4/2003 | Seymour et al. |
| 6,547,411 | B1 | 4/2003 | Dornbusch |
| 6,558,928 | B1 | 5/2003 | Landegren |
| 6,580,344 | B2 | 6/2003 | Li |
| 6,590,172 | B1 | 7/2003 | Gadre et al. |
| 6,590,753 | B1 | 7/2003 | Finlay |
| 6,593,530 | B2 | 7/2003 | Hunt |
| 6,621,388 | B1 | 9/2003 | Macbeth |
| 6,628,486 | B1 | 9/2003 | Macbeth |
| 6,646,838 | B2 | 11/2003 | Ziegler et al. |
| 6,657,834 | B2 | 12/2003 | DiSalvo |
| 6,670,870 | B2 | 12/2003 | Macbeth |
| 6,670,872 | B2 | 12/2003 | Kurzmann |
| 6,671,145 | B2 | 12/2003 | Germain et al. |
| 6,693,779 | B2 | 2/2004 | DiSalvo |
| 6,717,782 | B2 | 4/2004 | DiSalvo et al. |

| | | | |
|---|---|---|---|
| 6,734,769 | B1 | 5/2004 | Germain et al. |
| 6,749,449 | B2 | 6/2004 | Mortun et al. |
| 6,765,149 | B1 | 7/2004 | Ku |
| 6,767,228 | B2 | 7/2004 | Katz |
| 6,771,152 | B2 | 8/2004 | Germain et al. |
| 6,776,630 | B1 | 8/2004 | Huang |
| 6,786,745 | B1 | 9/2004 | Huang |
| 6,788,173 | B2 | 9/2004 | Germain et al. |
| 6,796,690 | B2 | 9/2004 | Bohlander |
| 6,805,469 | B1 | 10/2004 | Barton |
| 6,808,283 | B2 | 10/2004 | Tsao |
| 6,813,126 | B2 | 11/2004 | DiSalvo et al. |
| 6,827,602 | B2 | 12/2004 | Greene et al. |
| 6,828,886 | B2 | 12/2004 | Germain et al. |
| 6,842,095 | B2 | 1/2005 | Macbeth |
| 6,857,760 | B2 | 2/2005 | Chien et al. |
| 6,864,766 | B2 | 3/2005 | DiSalvo et al. |
| 6,864,769 | B2 | 3/2005 | Germain et al. |
| 6,873,231 | B2 | 3/2005 | Germain et al. |
| 6,883,927 | B2 | 4/2005 | Cunningham et al. |
| D505,395 | S | 5/2005 | Fort et al. |
| 6,888,323 | B1 | 5/2005 | Null et al. |
| 6,893,275 | B2 | 5/2005 | Ng et al. |
| 6,900,972 | B1 | 5/2005 | Chan et al. |
| 6,929,376 | B2 | 8/2005 | Harris |
| 6,930,574 | B2 | 8/2005 | Gao |
| 6,937,451 | B2 | 8/2005 | Ulrich et al. |
| 6,944,001 | B2 | 9/2005 | Ziegler et al. |
| 6,949,994 | B2 | 9/2005 | Germain et al. |
| 6,958,895 | B1 | 10/2005 | Radosavljevic et al. |
| 6,962,505 | B1 | 11/2005 | Savicki, Jr. et al. |
| 6,963,260 | B2 | 11/2005 | Germain et al. |
| 6,969,801 | B2 | 11/2005 | Radosavljevic et al. |
| 6,975,192 | B2 | 12/2005 | Disalvo |
| 6,975,492 | B2 | 12/2005 | DiSalvo |
| 6,979,212 | B1 | 12/2005 | Gorman |
| 6,982,856 | B2 | 1/2006 | Bernstein |
| 6,986,589 | B2 | 1/2006 | Evans et al. |
| 6,986,674 | B1 | 1/2006 | Gorman |
| D515,448 | S | 2/2006 | Nelson et al. |
| D515,449 | S | 2/2006 | Nelson et al. |
| D515,959 | S | 2/2006 | Nelson et al. |
| D515,960 | S | 2/2006 | Nelson et al. |
| 6,998,945 | B2 | 2/2006 | Huang et al. |
| 7,004,595 | B1 | 2/2006 | Stoddard |
| 7,011,422 | B2 | 3/2006 | Robertson et al. |
| 7,019,952 | B2 | 3/2006 | Huang et al. |
| 7,026,895 | B2 | 4/2006 | Germain et al. |
| 7,031,125 | B2 | 4/2006 | Germain et al. |
| 7,036,948 | B1 | 5/2006 | Wyatt |
| 7,042,688 | B2 | 5/2006 | Chan et al. |
| 7,045,975 | B2 | 5/2006 | Evans |
| 7,049,910 | B2 | 5/2006 | Campolo et al. |
| 7,049,911 | B2 | 5/2006 | Germain et al. |
| 7,081,009 | B2 | 7/2006 | Gorman |
| 7,082,021 | B2 | 7/2006 | Chan et al. |
| 7,086,892 | B2 | 8/2006 | Tanacan et al. |
| 7,088,205 | B2 | 8/2006 | Germain et al. |
| 7,088,206 | B2 | 8/2006 | Germain et al. |
| 7,118,235 | B2 | 10/2006 | Barton |
| 7,121,707 | B2 | 10/2006 | Currie et al. |
| D534,873 | S | 1/2007 | Merritt et al. |
| D535,627 | S | 1/2007 | Merritt et al. |
| 7,165,864 | B2 | 1/2007 | Miller |
| 7,168,974 | B2 | 1/2007 | Feldman et al. |
| 7,177,126 | B2 | 2/2007 | Ulrich et al. |
| 7,179,992 | B1 | 2/2007 | Packard et al. |
| 7,195,500 | B2 | 3/2007 | Huang et al. |
| 7,209,330 | B2 | 4/2007 | DiSalvo |
| D542,230 | S | 5/2007 | Merritt et al. |
| D543,159 | S | 5/2007 | Merritt et al. |
| 7,213,932 | B1 | 5/2007 | Savicki, Jr. |
| 7,227,435 | B2 | 6/2007 | Germain et al. |
| 7,234,844 | B2 | 6/2007 | Bolta et al. |
| 7,265,291 | B1 | 9/2007 | Gorman |
| 7,265,956 | B2 | 9/2007 | Huang |
| D553,102 | S | 10/2007 | Merritt et al. |
| 7,285,723 | B2 | 10/2007 | Lindenstraus et al. |
| 7,289,306 | B2 | 10/2007 | Huang |

| | | | | |
|---|---|---|---|---|
| 7,295,415 | B2 | 11/2007 | Huang et al. | |
| 7,312,394 | B1 | 12/2007 | Weeks et al. | |
| 7,315,227 | B2 | 1/2008 | Huang et al. | |
| 7,317,600 | B2 | 1/2008 | Huang et al. | |
| D564,129 | S | 3/2008 | Tufano et al. | |
| 7,355,117 | B2 | 4/2008 | Castaldo et al. | |
| 7,357,652 | B1 | 4/2008 | Arenas et al. | |
| 7,360,912 | B1 | 4/2008 | Savicki, Jr. | |
| 7,416,310 | B1 | 8/2008 | Savicki, Jr. | |
| 7,455,538 | B2 | 11/2008 | Germain | |
| 7,538,647 | B2 | 5/2009 | Leopold | |
| D595,229 | S | 6/2009 | LaGrotta | |
| 7,551,047 | B2 | 6/2009 | Sokolow et al. | |
| D598,859 | S | 8/2009 | Vaccaro et al. | |
| 7,586,718 | B1 | 9/2009 | Radosavljevic et al. | |
| D601,962 | S | 10/2009 | Song | |
| D603,983 | S | 11/2009 | Richter et al. | |
| D603,984 | S | 11/2009 | Richter et al. | |
| D603,985 | S | 11/2009 | Richter et al. | |
| D604,873 | S | 11/2009 | Richter et al. | |
| 7,651,347 | B2 | 1/2010 | Germain et al. | |
| 7,666,010 | B2 | 2/2010 | Arenas et al. | |
| 7,683,745 | B2 | 3/2010 | Gouhl et al. | |
| D614,572 | S | 4/2010 | Oddsen et al. | |
| 7,701,680 | B2 | 4/2010 | Li et al. | |
| 7,712,949 | B2 | 5/2010 | Tufano et al. | |
| 7,726,825 | B2 | 6/2010 | Mandapat et al. | |
| 7,736,174 | B2 | 6/2010 | Bhosale et al. | |
| 7,762,838 | B2 | 7/2010 | Gorman | |
| 7,820,909 | B2 | 10/2010 | Castaldo et al. | |
| D631,440 | S | 1/2011 | Lamoureux et al. | |
| 7,862,350 | B2 * | 1/2011 | Richter et al. | 439/107 |
| D634,866 | S | 3/2011 | Richter et al. | |
| 7,955,096 | B2 | 6/2011 | Arenas et al. | |
| 8,242,362 | B2 | 8/2012 | Castaldo et al. | |
| 2002/0064779 | A1 | 5/2002 | Landegren et al. | |
| 2002/0172042 | A1 | 11/2002 | Wen-Chung | |
| 2003/0005783 | A1 | 1/2003 | Chen et al. | |
| 2003/0092297 | A1 | 5/2003 | Reindle et al. | |
| 2003/0102944 | A1 | 6/2003 | Leopold et al. | |
| 2003/0151478 | A1 | 8/2003 | Radosavljevic et al. | |
| 2004/0147148 | A1 | 7/2004 | Ng et al. | |
| 2005/0002138 | A1 | 1/2005 | Germain et al. | |
| 2005/0012633 | A1 | 1/2005 | Yoon | |
| 2005/0063110 | A1 | 3/2005 | DiSalvo et al. | |
| 2005/0124209 | A1 | 6/2005 | Currie et al. | |
| 2005/0152128 | A1 | 7/2005 | Campman | |
| 2006/0007611 | A1 | 1/2006 | Ziegler et al. | |
| 2006/0132266 | A1 | 6/2006 | DiSalvo | |
| 2006/0139132 | A1 | 6/2006 | Porter et al. | |
| 2006/0273859 | A1 | 12/2006 | Germain et al. | |
| 2007/0026701 | A1 | 2/2007 | Kurek et al. | |
| 2007/0049077 | A1 | 3/2007 | Germain | |
| 2007/0049079 | A1 | 3/2007 | Nalwad et al. | |
| 2007/0111569 | A1 | 5/2007 | Germain et al. | |
| 2007/0114053 | A1 | 5/2007 | Castaldo et al. | |
| 2007/0126539 | A1 | 6/2007 | DiSalvo | |
| 2007/0171625 | A1 | 7/2007 | Glazner | |
| 2007/0183160 | A1 | 8/2007 | Tufano et al. | |
| 2007/0193866 | A1 | 8/2007 | Eder et al. | |
| 2007/0211397 | A1 | 9/2007 | Sokolow et al. | |
| 2007/0251712 | A1 | 11/2007 | Berg et al. | |
| 2007/0291469 | A1 | 12/2007 | Chen | |
| 2008/0073117 | A1 | 3/2008 | Misener | |
| 2008/0233780 | A1 | 9/2008 | Waters et al. | |
| 2009/0032278 | A1 | 2/2009 | Weeks et al. | |
| 2009/0035967 | A1 | 2/2009 | Weeks et al. | |
| 2009/0052162 | A1 | 2/2009 | Richter et al. | |
| 2009/0103329 | A1 | 4/2009 | Wu et al. | |
| 2009/0109653 | A1 | 4/2009 | Wu et al. | |
| 2009/0141477 | A1 | 6/2009 | Bhosale et al. | |
| 2010/0120274 | A1 | 5/2010 | Arenas et al. | |
| 2010/0227484 | A1 | 9/2010 | Arenas et al. | |
| 2011/0228552 | A1 | 9/2011 | Kevelos et al. | |
| 2012/0170292 | A1 | 7/2012 | Bhosale et al. | |

FOREIGN PATENT DOCUMENTS

| | | |
|---|---|---|
| DE | 28 21 138 | 11/1978 |
| DE | 3 431 581 | 3/1986 |
| EP | 0 081 661 | 6/1983 |
| EP | 0411388 | 2/1991 |
| EP | 0 526 071 | 2/1993 |
| ES | 21345 | 5/1977 |
| FR | 2391549 | 12/1978 |
| GB | 227930 | 1/1925 |
| GB | 830018 | 3/1960 |
| GB | 2207823 | 2/1989 |
| GB | 2 290 181 | 12/1995 |
| GB | 2 292 491 | 2/1996 |
| JP | 61 259428 | 11/1986 |
| JP | 2005-116252 | 4/2005 |
| JP | 2005-183319 | 7/2005 |
| KR | 10-2005-0119842 | 12/2005 |
| WO | WO 96/01484 | 1/1996 |
| WO | WO 00/11696 | 3/2000 |
| WO | WO 00/45366 | 8/2000 |
| WO | WO 01/15183 | 3/2001 |
| WO | WO 02/33720 | 4/2002 |
| WO | WO 2004/070751 | 8/2004 |
| WO | WO 2004/070752 | 8/2004 |
| WO | 2010005987 | 1/2010 |

OTHER PUBLICATIONS

Table of Contents 2 pages.
Pass and Seymour Legrand Advertisement, Copyright 2004.
International Search Report and Written Opinion of the International Searching Authority, mailed on Feb. 27, 2009 for PCT/US2008/073098 which was filed on Aug. 14, 2008.
T2780-W, 3 pages.
Design U.S. Appl. No. 29/367,882, filed Aug. 13, 2010.
U.S. Appl. No. 12/981,745, filed Dec. 12, 2010.
Table of Contents of the Leviton Catalog titled “L-100 Leviton Wiring Device Catalog”, Dated Jan. 30, 2006, 2 pages.
“Product Bulletin for Tamper-Resistant Surge Protection Receptacles” Copyrighted by Leviton in 2009, 6 pages.
International Search Report and Written Opinion of PCT/US2011/046415 filed on Aug. 3, 2011 which was mailed on Feb. 29, 2012. 13 pages.
Leviton Specifier Catalog Z-76, Leviton Manufacturing Company Inc., May 1977.
Leviton Wiring Device Catalog D-400, Leviton Manufacturing Company, Inc., 1997.
Van Nostrand’s Scientific Encyclopedia Sixth Edition Copyright 1983.

* cited by examiner

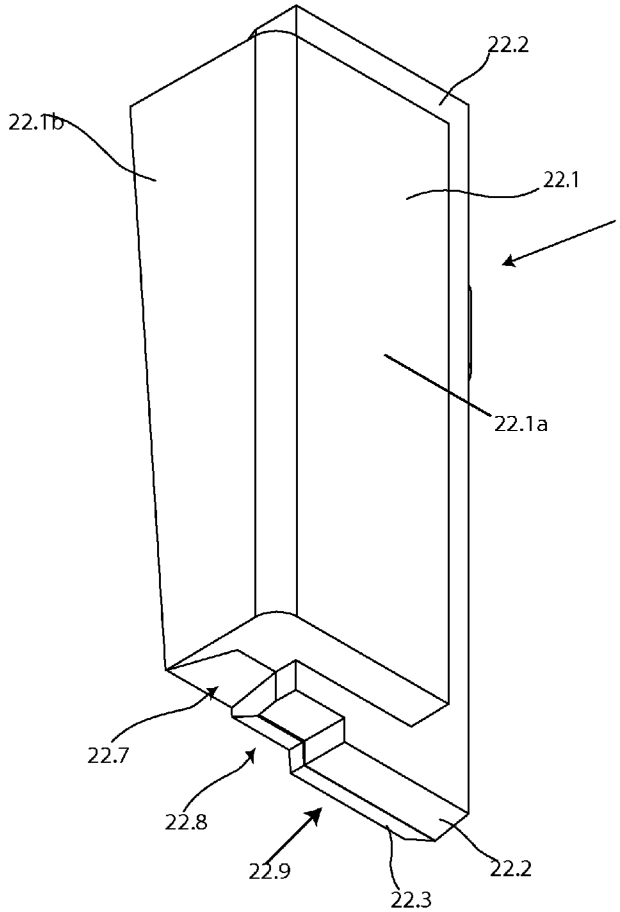
FIG. 5
FIG. 6
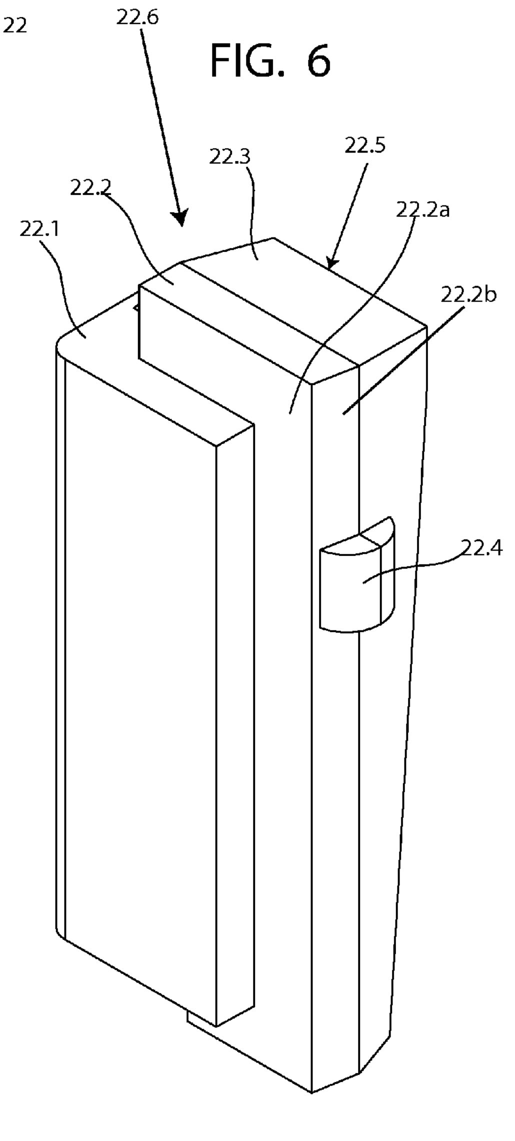

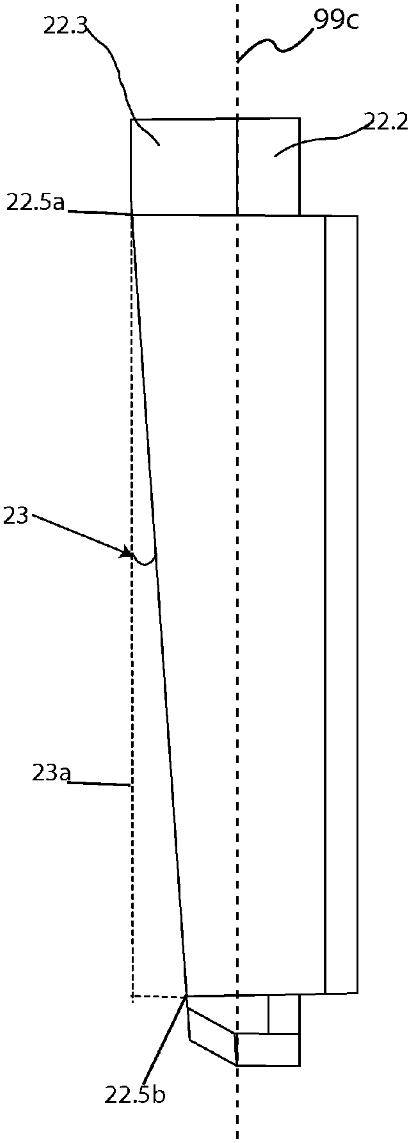
FIG. 7
FIG. 8
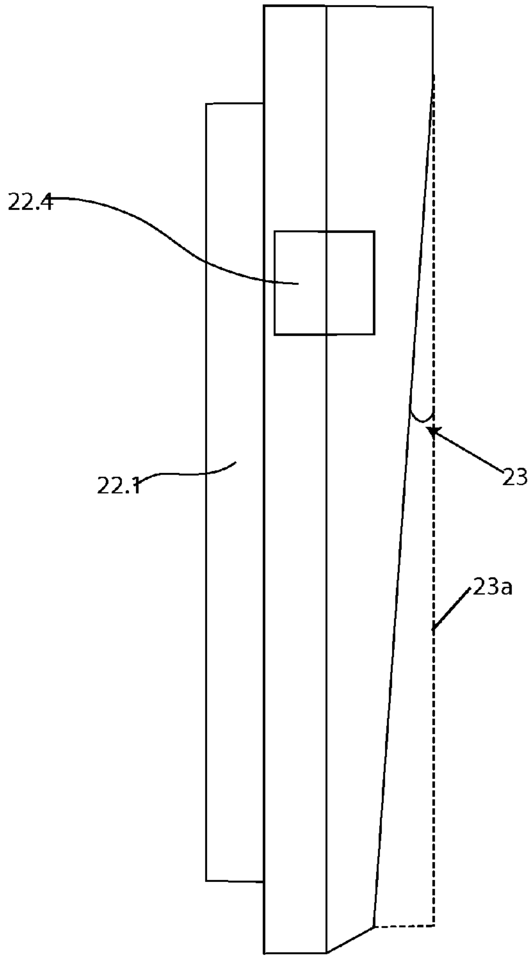

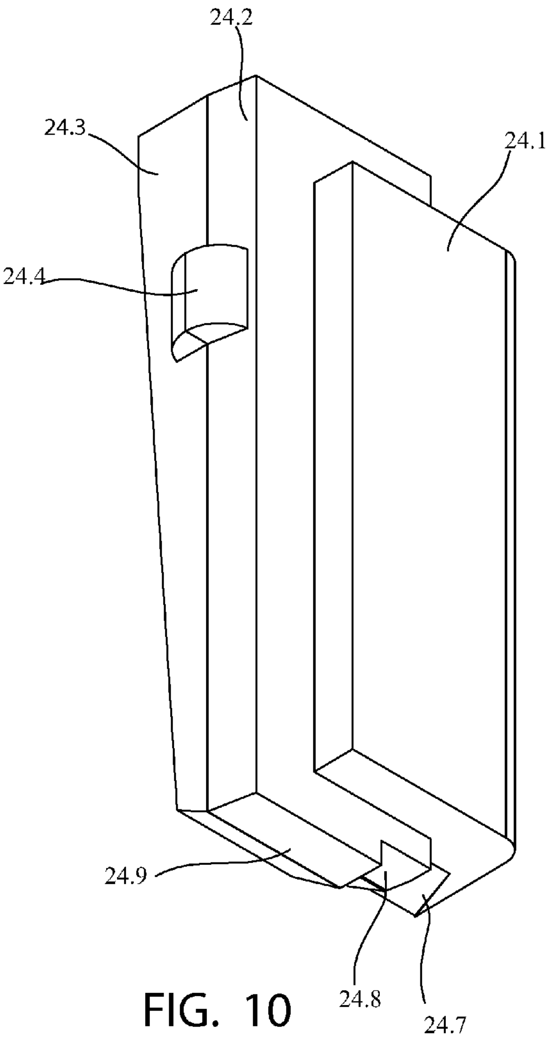
FIG. 10
FIG. 11
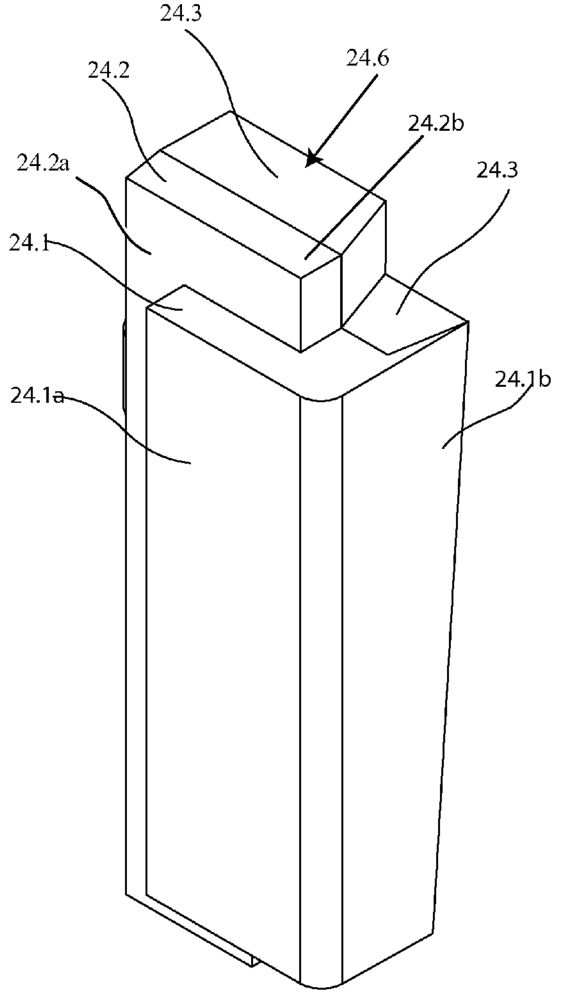

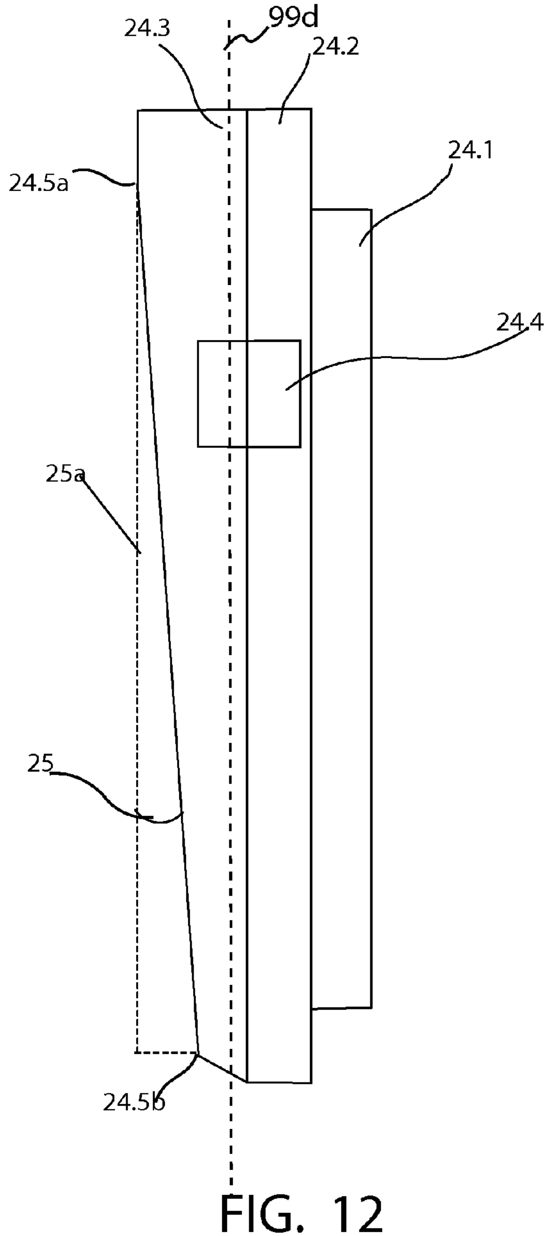
FIG. 12
FIG. 13
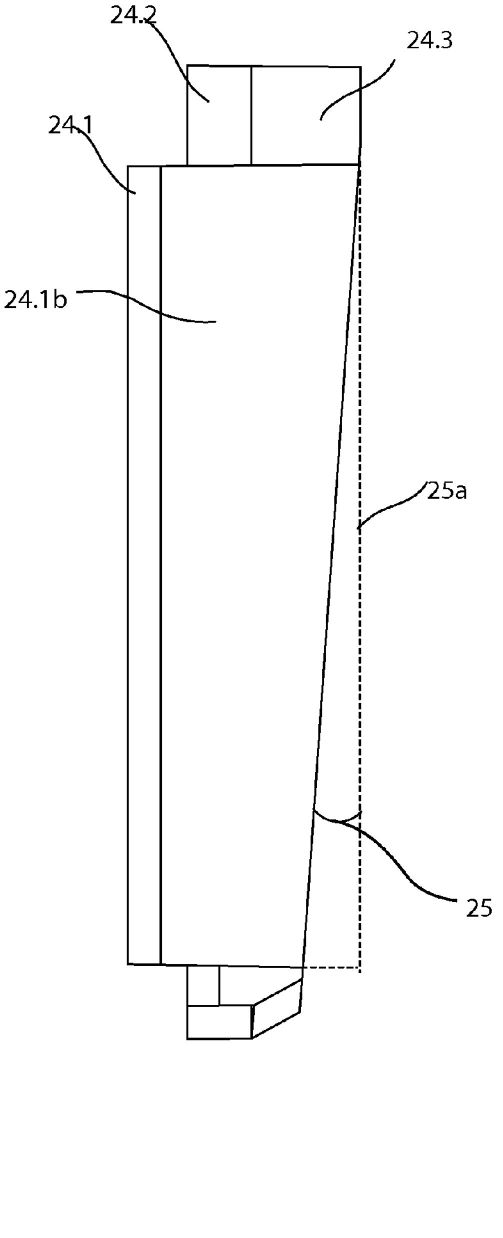

WIRING DEVICE WITH ILLUMINATION

BACKGROUND OF THE INVENTION

The invention relates to a wiring device having illumination. At least one other patent application relating to wiring devices having illumination is known in the art, wherein this application is published as publication number US09/0052162 and which was filed as U.S. patent application Ser. No. 11/841,624 filed on Aug. 20, 2007, the disclosure of which is hereby incorporated herein by reference in its entirety.

Lights when illuminated provide a light radiation pattern. Many lights are formed as a sphere or dome and emit light in many different directions. However, along the emission spectrum of this radiation, there is a radiation pattern that forms either a point or a band of peak emission. Thus, while in theory, a light can have an omnidirectional emission pattern, lights such as an incandescent bulb or an LED provide a directed light source. Thus, lights can be focused or pointed in a particular direction to provide a peak radiation pattern direction that points along a particular axis. This peak radiation pattern direction can be in the form of a particular point source of light or along a band of light which can be for example a center beam. Thus, an LED can be pointed so that its light directed along a particular path such that when the LED is "pointed" in a direction, the peak of the radiation pattern points in this direction. In some cases, the light can be pointed so that this peak radiation pattern then points directly outside of the housing of an electrical device. Lights, and their size may be restricted in their application based upon space constraints. For example, the lights may be inserted into a single gang duplex type device which is housed inside of a single gang electrical enclosure.

Single gang electrical enclosures, such as a single gang wall boxes, are generally enclosures that are configured to house electrical devices of a particular heights, widths and depths. In many cases, single gang metallic boxes can vary in height from 2⅞ to 3 ⅞" and in width from 1¹³⁄₁₆ to 2", while single gang non-metallic boxes can vary in height from 2¹⁵⁄₁₆ to 3⁹⁄₁₆" and in width from 2 to 2¹⁄₁₆". Therefore, for purposes of this disclosure, a standard single gang box would have a width of up to 2½ inches. A non standard single gang box would have a width of even larger dimensions up to the minimum classification for a double gang box, and any appropriate height such as up to approximately 3⅞". It is noted that the width of a double gang box is 3¹³⁄₁₆ according to NEMA standards. See NEMA Standards Publication OS 1-2003 pp 68, Jul. 23, 2003.

Another NEMA standard WD-6 has a single gang wall box opening being 2.812 inches long by 1.75 inches wide with varying depths.

To fit a light inside of a single gang enclosure, it may be necessary to observe design considerations to orient these lights in a particular direction. Thus, based upon design considerations, it may be necessary to have a light orientated such that the peak radiation direction extends substantially parallel to a face of a housing or substantially perpendicular to a desired emission direction. Therefore, there is a need for a light pipe which receives light emitted from a light source and which then translates this emission in a direction different from a direction of a peak radiation pattern of a light source.

SUMMARY OF THE INVENTION

One embodiment of the invention relates to an electrical device having illumination comprising a housing and at least one light pipe extending along a longitudinal axis, inside the housing. There is at least one light disposed in the housing and being positioned adjacent to the light pipe. The light has a radiation pattern having a corresponding peak radiation pattern direction which extends along the longitudinal axis of the light pipe. The light pipe can have a surface which is configured to receive a substantial portion of the emitted light beam from the light.

The light pipe can have an internally reflective surface which reflects light out from the light pipe in a direction transverse, substantially transverse, perpendicular, or substantially perpendicular to the peak emission direction causing light to be emitted from the housing in a direction transverse or substantially transverse to the longitudinal axis of the light pipe. Thus, the light pipe translates light radiation emitted from the light source so that it leaves the housing of the electrical device.

One of the benefits of this type light pipe is that this light translation allows lights to be positioned in any desired direction inside of a housing. This allows for the positioning of lights such as LED lights into a housing having space constraints, allowing for additional electronic components to be fit into the housing. Another benefit is that because much of the light radiation inserted into the light pipe is internally reflected from a point inside the light pipe to outside of this light pipe, the light pipe provides the appearance of a substantially uniform source of light with few, or no detectable peak radiation points.

Another benefit of at least one embodiment of the invention is that it includes an electrical device having a light pipe which has at least one surface which is angled relative to the light and which is configured to refract light out of the light pipe, and out of the housing of the electrical device.

In at least one embodiment, of the invention the angled surface of the light pipe is configured to be angled such that it still provides at least two exposed illuminated surfaces

BRIEF DESCRIPTION OF THE DRAWINGS

Other objects and features of the present invention will become apparent from the following detailed description considered in connection with the accompanying drawings. It should be understood, however, that the drawings are designed for the purpose of illustration only and not as a definition of the limits of the invention.

In the drawings, wherein similar reference characters denote similar elements throughout the several views:

FIG. 5 is a bottom-left perspective view of the left light pipe shown in FIG. 3;

FIG. 6 is a top-right perspective view of the left light pipe shown in FIG. 3;

FIG. 7 is a left side view of the left light pipe shown in FIG. 3;

FIG. 8 is a right side view of the left light pipe shown in FIG. 3;

FIG. 10 is a bottom-left perspective view of the right light pipe shown in FIG. 3;

FIG. 11 is a top-right view of the right light pipe shown in FIG. 3;

FIG. 12 is a right side view of the right light pipe shown in FIG. 3;

FIG. 13 is a left side view of the right light pipe shown in FIG. 3;

DETAILED DESCRIPTION OF PREFERRED EMBODIMENTS

Figure 1A:
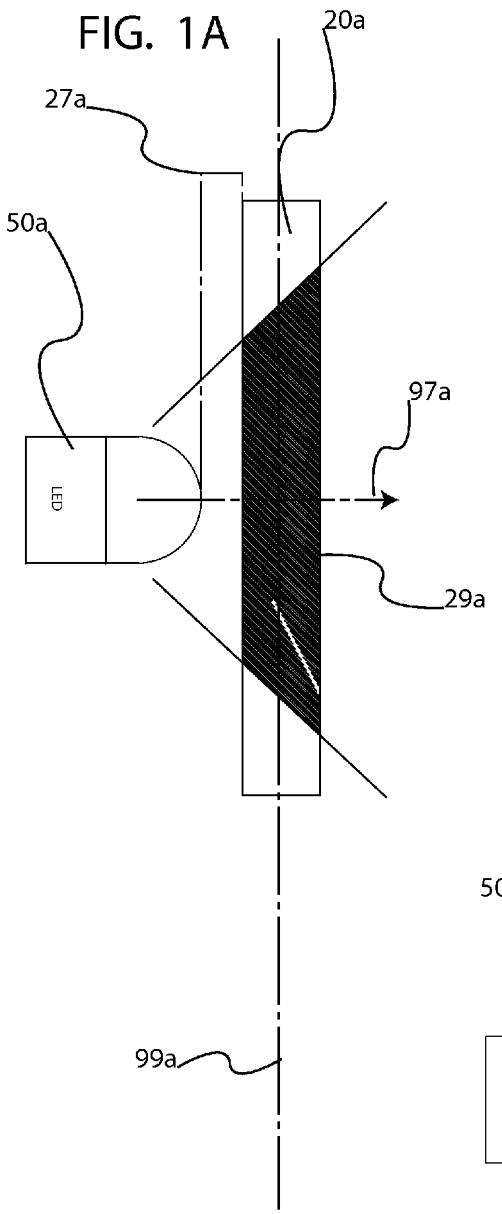
FIG. 1A is a view of a first type of design.
Figure 1B:
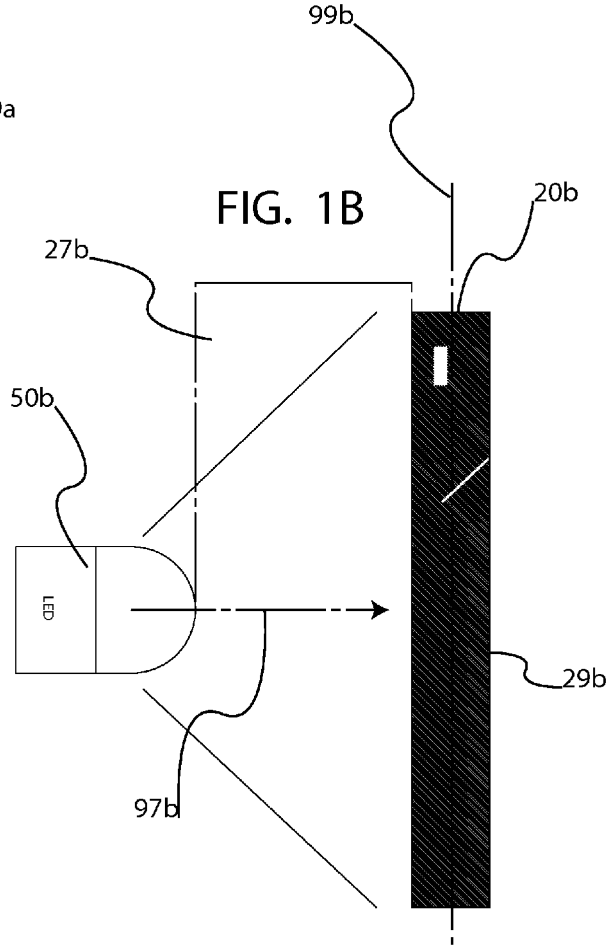
FIG. 1B is a view of a second type of design.

FIGS. 1A and 1B show similar first and second types of designs. For example FIG. 1A shows a first type of design, wherein there is a light or light source 50*a* which is spaced at a first distance 27*a* from a light pipe 20*a* and showing a radiation pattern 29*a* which covers only a portion of the light pipe 20*a*. Light source 50*a* has a peak radiation pattern direction 97*a* which is substantially perpendicular to a longitudinal axis 99*a* of light pipe 20*a*. FIG. 1B shows an alternative design wherein peak radiation pattern 97*b* is also substantially perpendicular to longitudinal axis 99*b* of light pipe 99*b* however, because light or light source 50*b* is spaced at a distance 27*b* which is greater than distance 27*a* then this allows the radiation pattern 29*b* to cover the entire length of the light pipe 20*b*.

Figure 1C:
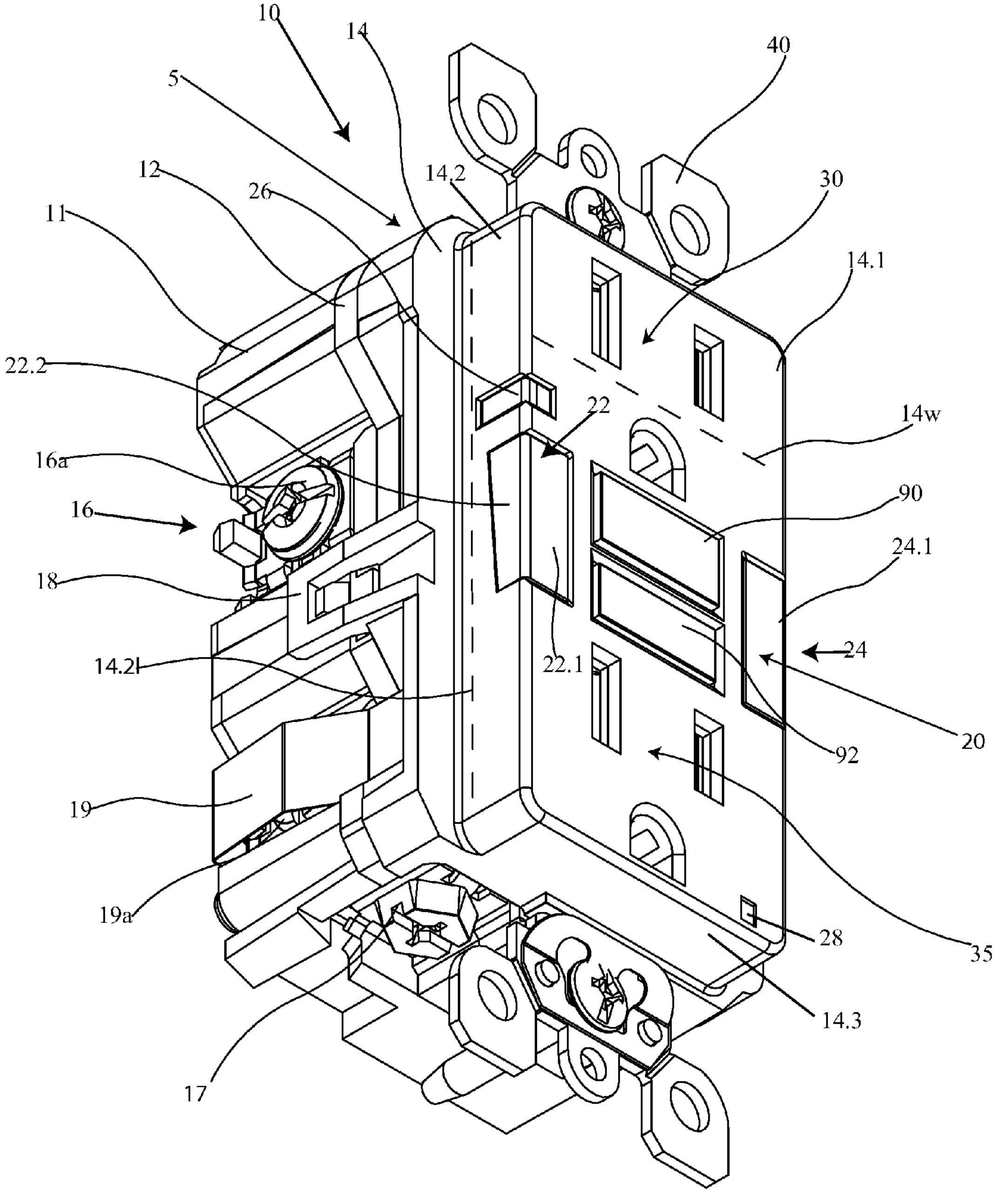
FIG. 1C is a bottom left perspective view of one embodiment.

FIG. 1C shows a bottom left perspective view of an embodiment of an electrical device 5 having illumination. An example of an electrical device is a duplex receptacle. Other types of electrical devices can comprise receptacles (duplex or not), switches, occupancy sensors, timers, fault circuit interrupters etc. A shown the electrical device can be configured to mount in a wall box. For example, device 5 has a housing 10 which includes a back housing 11, a middle housing 12 and a front housing 14 wherein this housing 10 is or in at least one embodiment is configured to mount in a wall box. These housings can be made from any suitable material such as metal, plastic, composite etc. In at least one embodiment the housings are made from a molded plastic. Front housing 14 includes a front face 14.1 having a length dimension 14.1L (See also FIG. 2) and a width dimension 14.1*w*. There are also five side faces including lateral side faces 14.2 and 14.5 which extend along the length 14.1L of front face 14 and width extending faces 14.3 and 14.4 which from this view form top and bottom faces (See also FIG. 2). In at least one embodiment, the housing 10 can be configured to mount in a wall box such that front face 14.1 is configured to be flush or substantially flush or at least parallel with an adjacent wall.

Coupled to housing 10, including back housing 11, is at least one terminal or contact 16 which includes a screw contact 16*a*. A clip 18 is used to connect the front housing 14, the middle housing 12 and the back housing 11 together, wherein the release of this clip allows for the disassembly of this device. There is also an oppositely spaced contact or terminal 16*b* shown in FIG. 2. A ground contact 17 is disposed on the bottom face of this device, which is configured to connect to a ground wire to ground the electrical device.

A cover 19 is used to cover a second set of terminals 19*a* and 19*b* (See FIG. 2) as well. This cover can be in any suitable form but in this case is in the form of a tape which can be removed to provide access to terminals used for downstream load connection.

Coupled to front face 14.1 is at least one light pipe 20 for at least one light. For example, there are a plurality of light pipes or translucent covers comprising a first light pipe 22, a second light pipe 24, a third light pipe 26 and a fourth light pipe 28. First light pipe 22 and second light pipe 24 can, in at least one embodiment, be configured entirely different from each other. In the present embodiment, second light pipe 24 is a minor image or substantial mirror image of first light pipe 22. First light pipe 22 is a left side light pipe shown in greater detail in FIGS. 5-9. Second light pipe 24 is a right side light pipe shown in greater detail in FIGS. 10-14. These light pipes are at least partially disposed in housing 10 with at least two exposed surfaces.

Front face 14.1 includes a plurality of openings including a first set of openings 30 which comprise at least one prong opening for receiving a plug. In addition, there is at least one additional set of openings 35 which are configured to receive a plug as well. These openings (See FIG. 2) include a first blade opening 31, a second blade opening 32, and a ground opening 33. In addition a second set of openings 35 include a first blade opening 36 a second blade opening 37 and a ground prong opening 38.

The electrical device 5 can be either strap based or non strap based mounting device, however, this strap is shown by way of example as strap 40. This strap shows screws which can be used to mount the device into a wall box. In this case, the device can be of any suitable size, however the device 5 is configured to be mounted into a single gang wall box.

Figure 3:
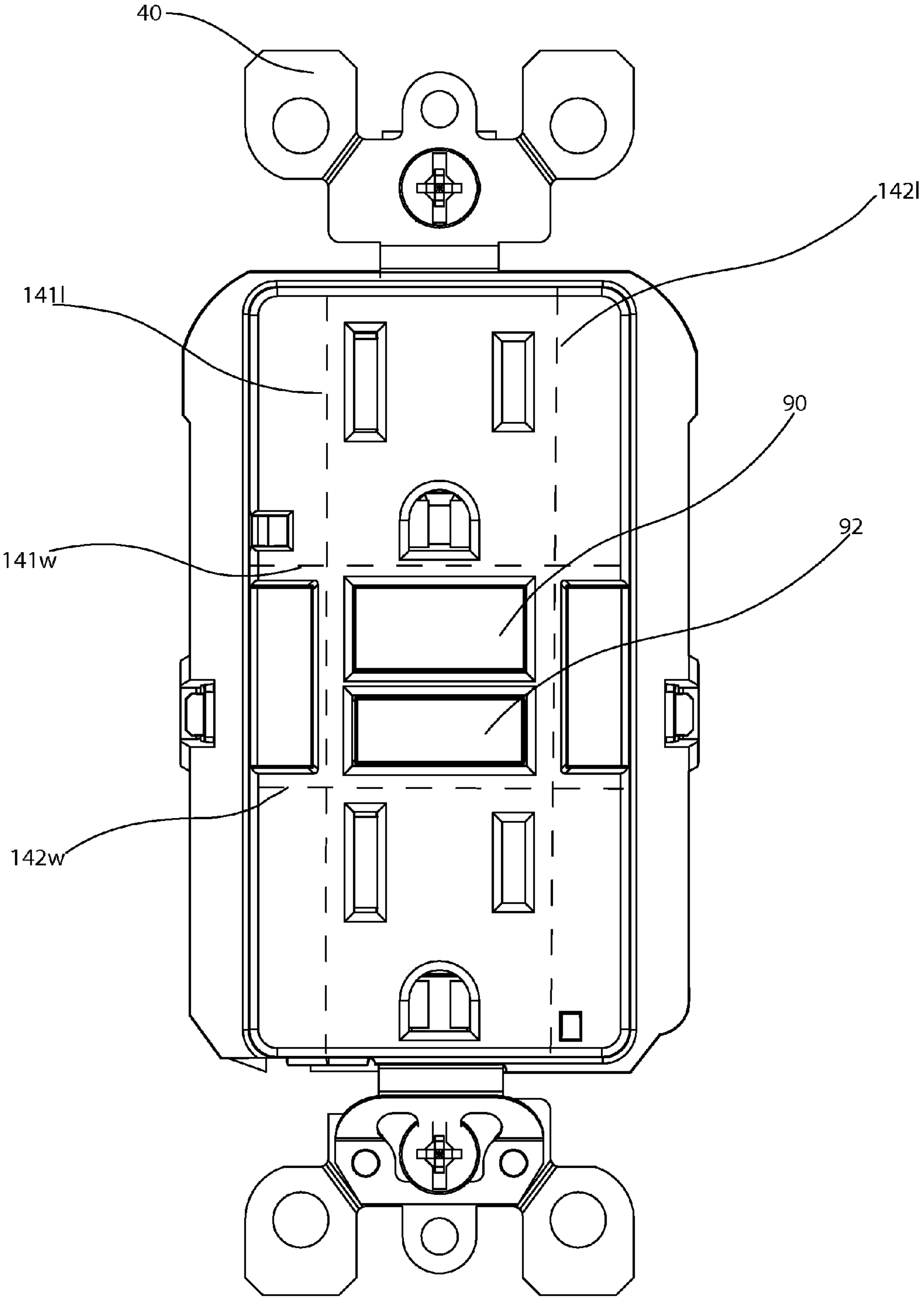
FIG. 3 is a front view of the embodiment shown in FIG. 1.

In addition, in this example, there is shown a test button 90 and a reset button 92, however these buttons are optional depending on the device used. For example, FIG. 3 shows dashed lines 141L, 142L, 141*w* and 142*w* forming longitudinal and latitudinal lines defining different areas on the front face. Longitudinal lines 141L and 142L extend along the length of the face 14.1 and define the width extension across the front face for each of light pipes 22 and 24. With this design, light pipe 22 extends at least 15% of the distance 14.1*w* across front face 14.1, and also extends at least 20% of a length along front face 14.1. These lines also which define the region occupied by the test button and the reset button. The size of these light pipes are thus configured to accommodate the test and reset buttons placed on this front face. However, if this test and reset button is configured differently, or not present, then the size of these light pipes can be configured larger. For example FIG. 4 simply shows a simplified front face with a region or area 120 which is configured to receive any type of interactive feature for any type of suitable electrical device. Electrical devices as described above including occupancy sensors, switches, dimmers, light control timers, remote control lighting systems, or any other type of system can be used.

The electrical device in this example is configured as a fault circuit interrupter including the reset button 90 and the test button 92. While one embodiment includes a standard ground fault circuit interrupter, other embodiments are not limited to ground fault circuit interrupters. Alternatively in any other embodiment, this device includes any one of an arc fault circuit interrupter, leakage currents interrupter (LCDI) residual current circuit interrupter, immersion detection circuit interrupter, shield leakage circuit interrupter, overcurrent circuit interrupter, undercurrent circuit interrupter, overvoltage, undervoltage circuit interrupter, line frequency circuit interrupter.

Figure 4:
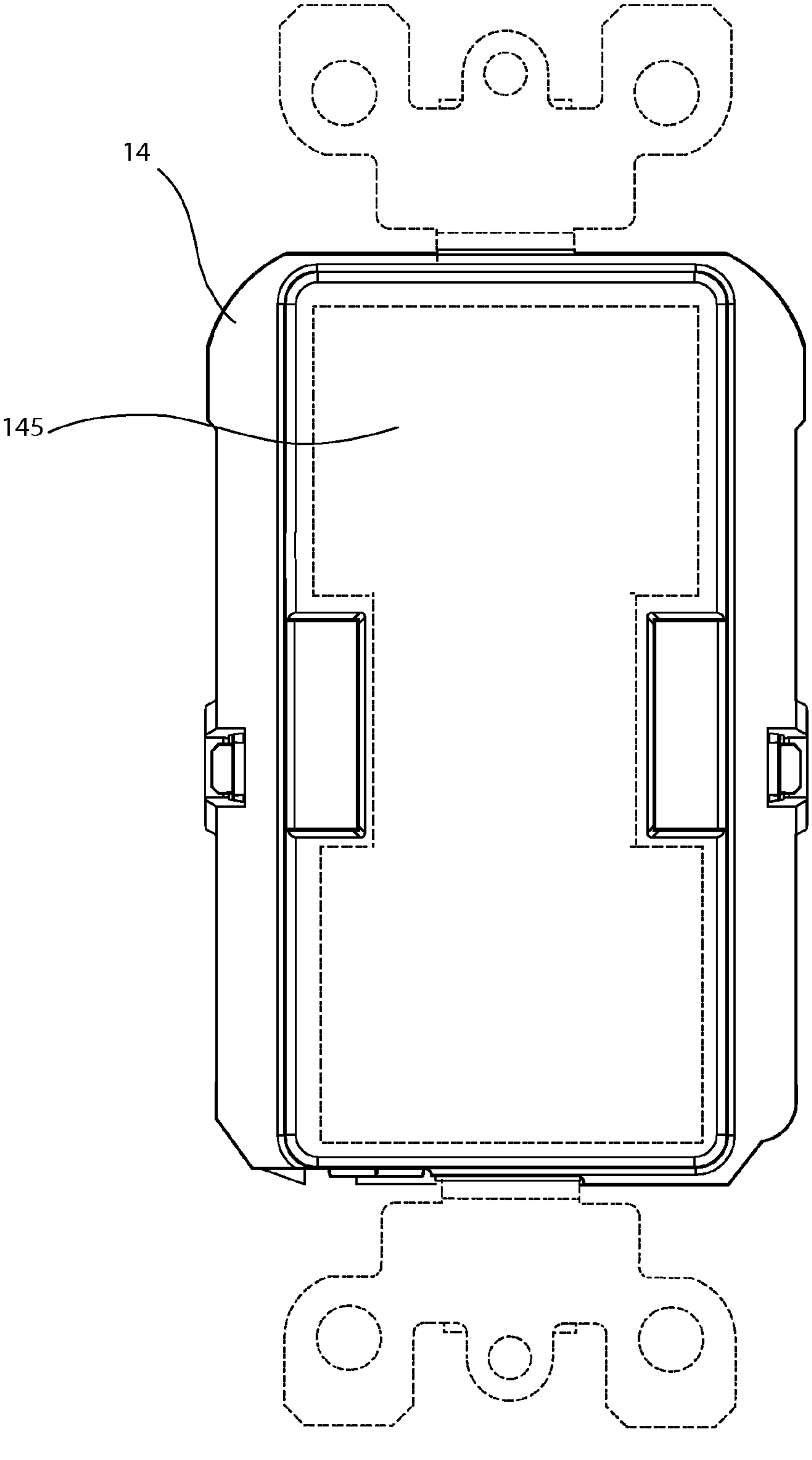
FIG. 4 is a front view of another embodiment.

In addition, the circuit interrupter is configured in at least one embodiment to determine any one of the following line characteristics noise, spike, surge, and/or any other electrical fault conditions. The device is also configured to connect in any known way such as directly to a power distribution network or through a connection to a plug tail type connection such as that shown in U.S. Pat. No. 7,357,652 which issued on Apr. 15, 2008, the disclosure of which is hereby incorporated herein by reference or by a connection shown in U.S. patent application Ser. No. 12/685,656 filed on Jan. 11, 2010 the disclosure of which is hereby incorporated herein by reference. Thus, as shown in FIG. 4 there is a region 145 wherein any other suitable electrical device can be used such as described above in the list of electrical devices. Therefore, this region 145 defines the region to place these electrical devices.

FIGS. 5 and 6 are perspective views of a light pipe 22 which is installed into housing 10. Light pipe 22 is made from any suitable transparent or translucent material such as a solid acrylic or polycarbonate material. The term translucent material refers to any material which is configured to allow light to pass there-through, regardless of visibility while the term transparent material is a material that is both translucent but also allows for substantial visibility through this light pipe. Therefore, as an example, a translucent light pipe could be a frosted light pipe while a transparent light pipe is for example a clear light pipe. Light pipe 22 comprises at least three different sections 22.1, 22.2. and 22.3. First section 22.1 is the outside emitting section which is configured as substantially L-shaped and which is coupled to the second and third sections 22.2 and 22.3. Second section 22.2 is a light transmitting intermediate section, while third section 22.3 is substantially translucent or transparent but includes a back reflective surface 22.5 (See FIG. 9). These different sections result in different surfaces either formed solely from a particular section or as a combination of sections. For example, first surface 22.1 includes a first section 22.1*a* configured to shine through the front side of the device, while surface 22.2*b* is configured to be positioned to shine out the lateral side of the device. These two sections 22.1*a* and 22.1*b* are exposed surfaces which are oriented substantially perpendicular to each other. Section 22.2 includes a first surface 22.2*a* which is considered a flange surface or tongue surface which is configured to lock the light pipe inside of the housing. This surface is mounted flush to the inside surface of the front face 14.1 Third section 22.3 has side surfaces and a back reflective surface 22.5 which is configured to reflect light up and out of the housing. There is also a tab 22.4 formed as a protrusion from a lateral non observant side of the light pipe and configured to lock the light pipe therein.

Figure 17:
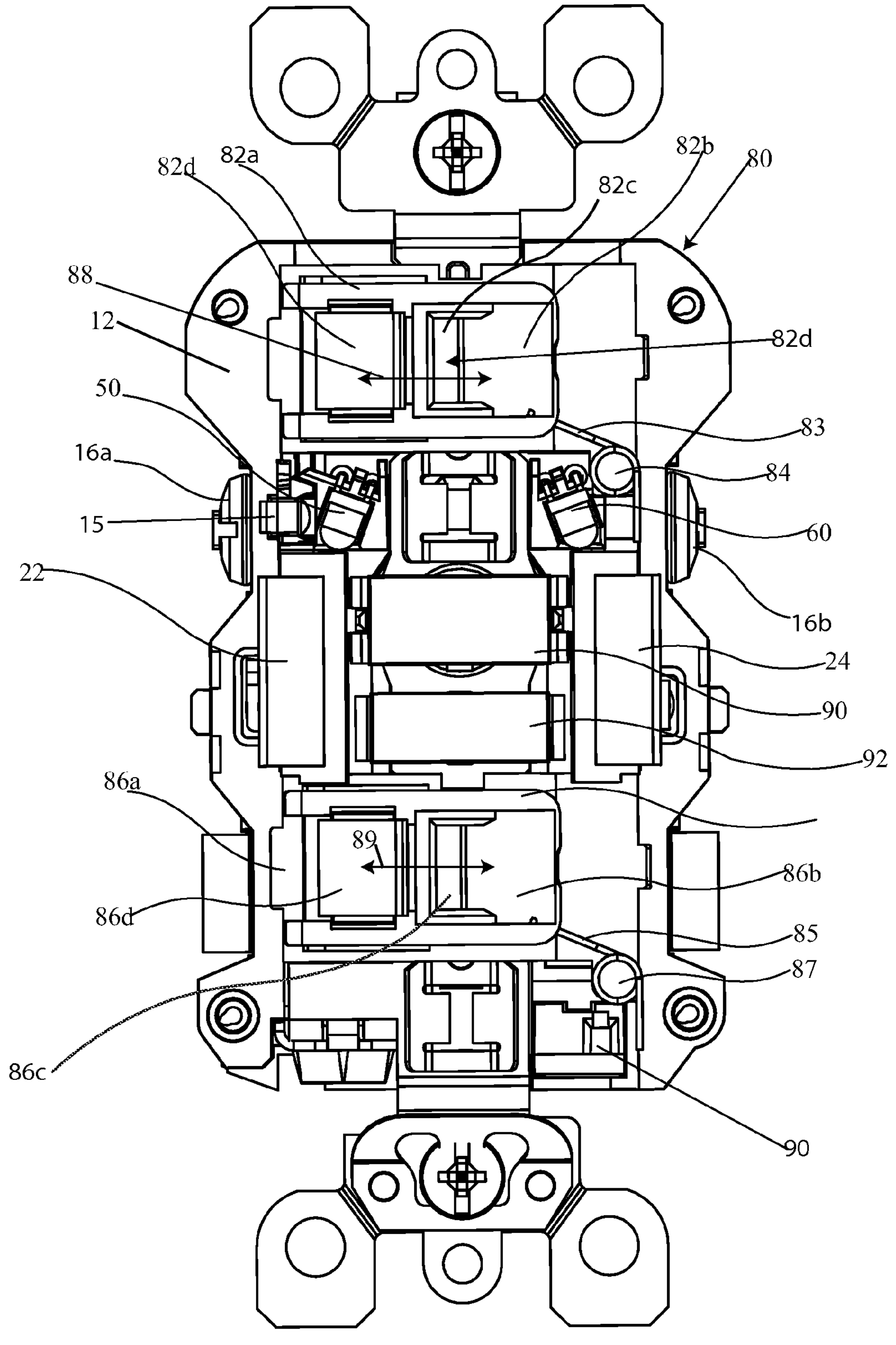
FIG. 17 is a front view of the electrical device shown in FIG. 1 with the front cover removed.

There are also at least five different combination surfaces 22.4, 22.6, 22.7. 22.8 and 22.9 Another surface 22.6 is configured to be in contact with, or disposed adjacent to an LED light as shown in FIG. 17. The opposite spaced surfaces 22.7, 22.8 and 22.9 in one embodiment are translucent or transparent but in another embodiment are configured as reflective, to reflect the light inserted into the light pipe.

These different stepped surfaces, particularly surfaces 22.8, and 22.9 provide a stepped flange surface area 22.2*a* for mounting the light pipe inside the housing.

As shown in greater detail in FIGS. 7 and 8, there is at least one angled surface formed from these different sections. For example, this angled surface is formed by back surface 22.5, such that light which is projected into this light pipe is reflected up and out from the light pipe. The angle 23 which is formed from this angled surface can be in the range of approximately 1-33 degrees depending on the dimensions of light pipe 22 or the desired amount of reflected light into the light pipe. The angle is calculated as the degrees from a line 23*a*, wherein this line is substantially parallel with a longitudinal axis 99*c* of light pipe 22 and also substantially parallel with front face 14.1 of front cover wherein light pipe 22 is mounted in the housing. This angle can also be calculated as the angle relative to front face 22.1 or relative to the longitudinal axis 99*c*. Thus, extending along the length of this light pipe 22 from a first position to a second position, back surface 22.5 gradually slopes towards the front face 22.1*a*, and towards a peak radiation pattern axis 97 (see FIG. 15) when light pipe 22 is installed into the housing. In this case, the first position, 22.5*a* is closer to the light but further away from front face 14.1 than second position 22.5*b* which is farther away from the light source but closer to front face 14.1. Based upon the material properties inherent with light pipe 22, back surface 22.5 is an internally reflective surface which reflects light into the light pipe as it is emitted from the light/light source 50 or 60. This internally reflective surface can be formed by the boundary of the light pipe, based upon the optical properties of the material and the intersection angle of the light, or formed by a coating or application of another material onto the boundary of the light pipe forming a reflective surface.

Angle 23 is calculated based upon the index of refraction for the material used in light pipe 22. For example, in at least one embodiment the light pipe comprises a polycarbonate. Therefore, based upon the optical properties of polycarbonate, an angle 23, that is less than 33 degrees would be sufficient to refract, or reflect light back into the light pipe. Thus, this angled surface 22.5 is configured to reflect a predetermined amount of primary light. In one preferred embodiment, the angled surface is configured to reflect an entire amount or at least a substantial amount of primary light emitted from a light source such as a LED light 50, or LED light 60. In at least one embodiment LED lights such as lights 50 and 60 form a light source disposed adjacent to a light pipe such as light pipes 22 and 24. These light sources 50 and 60 are configured to project primary light into the light pipes. Primary light is essentially light inserted into a light pipe that is not yet internally reflected by one of the light pipe's surfaces. While polycarbonateis simply an example of one type material, other materials can be used as well. Therefore, other angles of incidence could be calculated based upon the index of refraction. Therefore, the angle of incidence which is low enough to cause reflection back into the light pipe is a reflection angle, while the angle of incidence which is high enough to cause light to be emitted from the light pipe is an emission angle.

Figure 15:
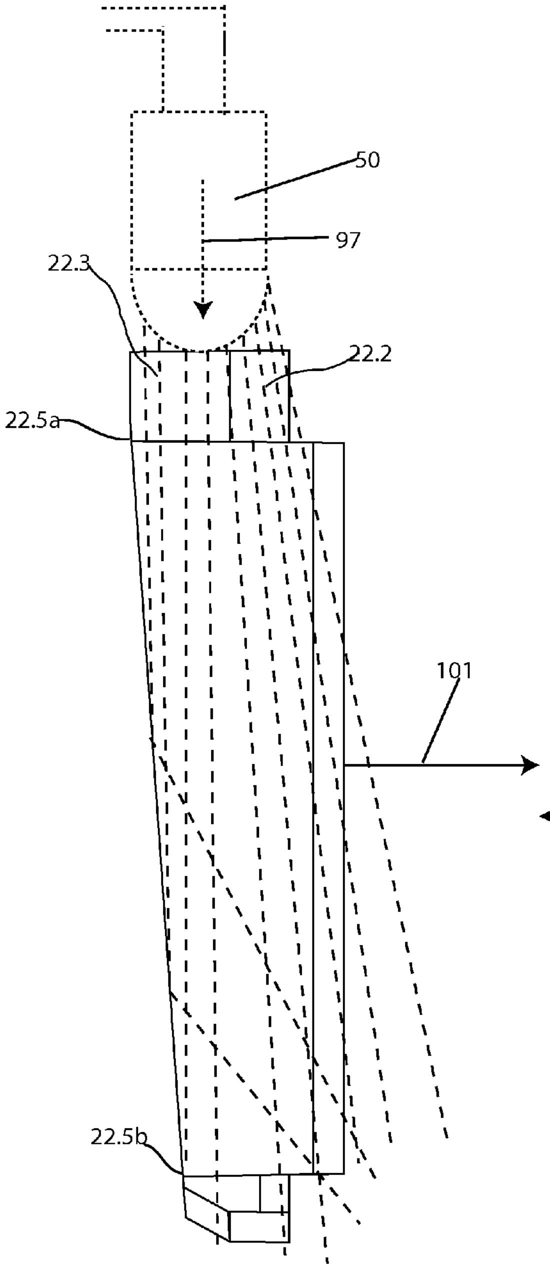
FIG. 15 is a view of a light and first light pipe combination showing a radiation pattern.

Another consideration when selecting an angle is that the light that is input into light pipe 22 is sent from a LED light such as LED light 50 (See for example FIG. 15). LED light 50 is pointed along the longitudinal axis of light pipe 22 such that the peak radiation pattern extends along an axis such as along arrow 97 shown in FIG. 15. To reduce the amount of light that leaves the far side of the light pipe, angled surface 22.5 is used. Therefore, for purposes of creating an entirely reflective surface, any angle up to the angle of emission can is used. However, the steeper the angle 23 that is used, the greater the amount of light that is reflected back into the light pipe, and out from surfaces 22.1 and 22.2. Therefore, as angle 23 is increased from some angle starting at 0 degrees, light pipe 22 becomes more efficient in emitting light thereby insuring that the peak radiation pattern axis 97 is directed towards the angled surface 23 and, wherein when the angle becomes greater up to the emission angle, a greater portion of the radiation pattern is then internally reflected into the light pipe.

Figure 2:
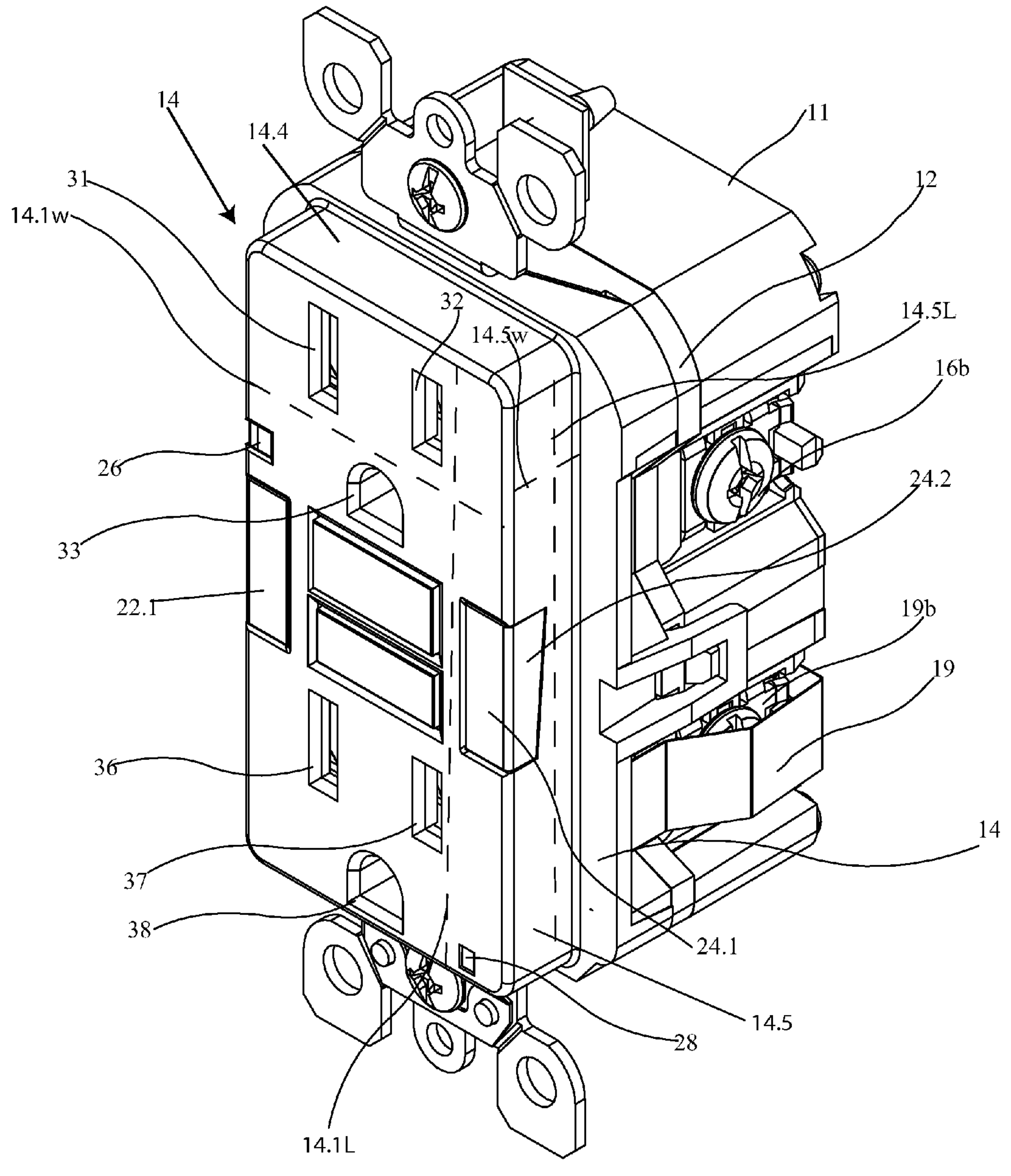
FIG. 2 is a top right perspective view of the embodiment shown in FIG. 1.

Another factor in determining the angle used is the desired amount of surface for faces 22.2 and 24.2 shown in FIGS. 1 and 2 respectively. If angle 23 is too high such as up to 32 degrees, then this would reduce the amount of surface area for surface 22.2 which would result in much less illumination out from this side face 22.2. Therefore, in at least one embodiment, angle 23 is calculated as 4 degrees.

One benefit from having a light pipe with two exposed surfaces such as surfaces 22.1 and 22.2 is that light is projected from both of these two different surfaces to spread light throughout an illuminated area. If surface 22.2 was not exposed outside of cover 14, then the additional area of illumination provided by these two different surfaces would not be available. In at least one embodiment surface 22.1 extends on a plane that is perpendicular or at least substantially perpendicular to surface 22.2. Thus three factors can be considered when determining an angle of extension of back surface 22.5 such as angle 23:1) the angle of incidence where light would leave light pipe 22; 2) an angle sufficient to provide an efficient projection of light from light pipe 22; 3) an angle sufficient to provide a second side surface such as surface 22.2 for projection of light.

This creates an angled reflective surface inside of the housing once the light pipe is installed which results in light being reflected internally inside of the light pipe and then emitted outside of this light pipe. In at least one embodiment this angle is 4 degrees. The back angled surface 22.5 can either be coated with a reflective material or not. Because the angle 23 is designed within the reflective optical properties of the light pipe, the light that is initially output from either light 50 or light 60 is initially refracted back internally on the light pipe.

Figure 9:
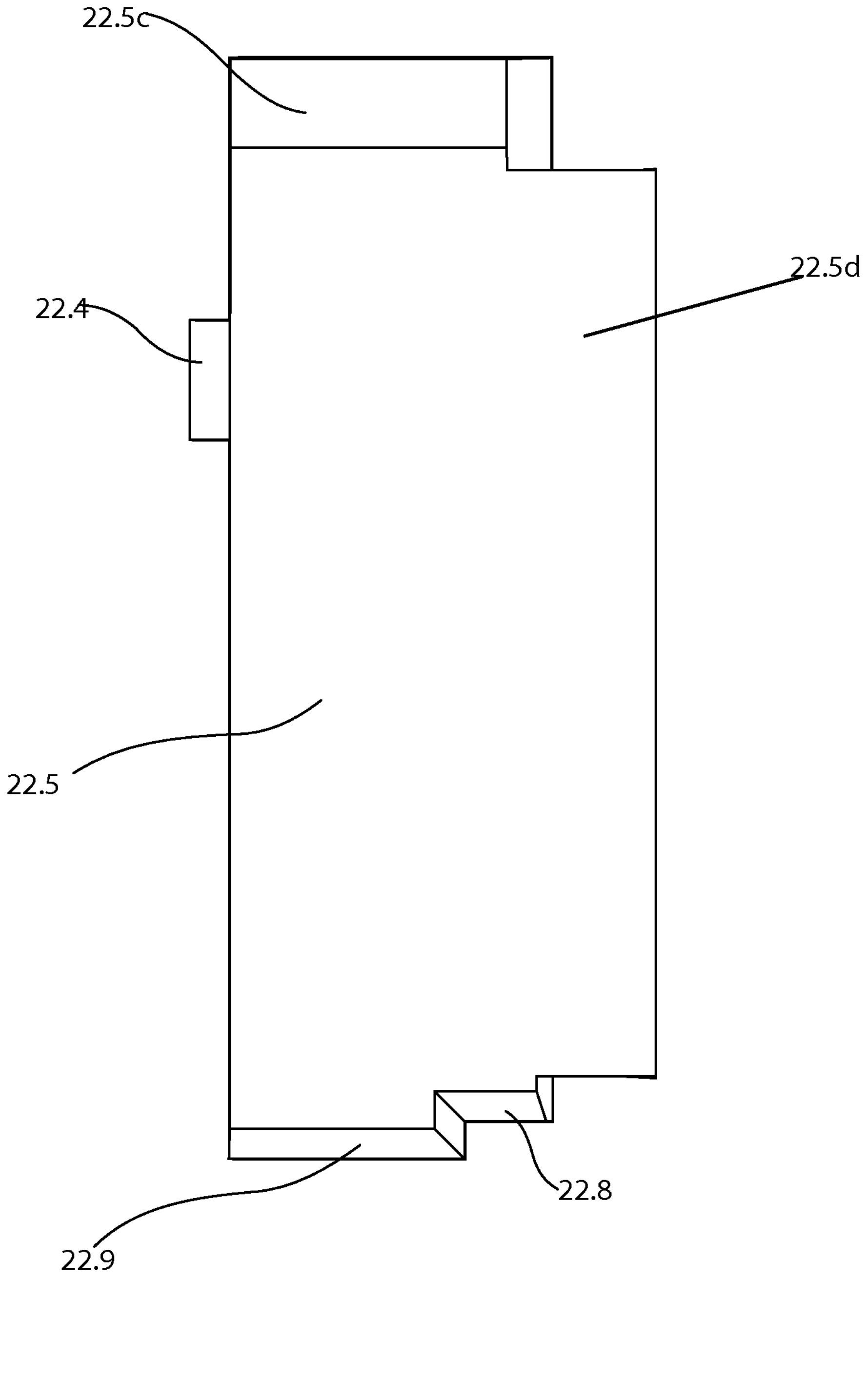
FIG. 9 is a back view of the left light pipe shown in FIG. 3.

FIG. 9 shows a back surface 22.5 of light pipe 22 which shows as reflective back surface, configured to allow light which shines into the light pipe to be reflected up and out of the light pipe. In at least one alternative embodiment, this surface is not reflective. In this view there are actually two surfaces, a first substantially flat surface 22.5*c* and a second angled surface 22.5*d*.

FIGS. 10-16 show the similar features of left light pipe 24. Left light pipe 24 is constructed at a minor image of light pipe 22 with the corresponding surfaces performing the same or similar tasks. For example, FIGS. 10 and 11 are perspective views of a light pipe 24 which is installed into housing 10. Light pipe 24 is made from any suitable transparent or translucent material such as a solid acrylic material. Light pipe 24 comprises at least three different sections 24.1 24.2. and 24.3. First section 24.1 is the outside emitting section which is configured as substantially L-shaped and which is coupled to the second and third sections 24.2 and 24.3. Second section 24.2 is a light transmitting intermediate section, while third section 24.3 is substantially translucent or transparent but includes a back reflective surface 24.5 (See FIG. 16). These different sections result in different surfaces either formed solely from a particular section or as a combination of sections. For example, first section 24.1 includes a first section or surface 24.1*a* configured to shine through the front side of the device, while section 24.1*b* extends substantially perpendicular to first surface 24.1*a* and is configured to be positioned to shine out the lateral side of the device. Section 24.2 includes a first surface 24.2*a* which is considered a flange surface or tongue surface which is configured to lock the light pipe inside of the housing. This surface is mounted flush to the inside surface of the front face 14.1 Third section 24.3 has side surfaces and a back internally reflective surface 24.5 which is configured to reflect light up and out of the housing. Tab 24.4 extends out from a lateral side of the light pipe.

There are also at least four different combination surfaces 24.6, 24.7, 24.8 and 24.9 Another surface 24.6 is configured to be in contact with, or disposed adjacent to an LED light as shown in FIG. 17. The opposite spaced surfaces 24.7, 24.8 and 24.9 in one embodiment are translucent or transparent but in another embodiment are configured as reflective, to reflect the light inserted into the light pipe.

These different stepped surfaces, particularly surfaces 24.8, and 24.9 provide a stepped flange surface area 24.2*a* for mounting the light pipe inside the housing.

As shown in greater detail in FIGS. 12 and 13, there is at least one angled surface formed from these different sections. For example, this angled surface is formed by back internally reflective surface 24.5, such that light which is projected into this light pipe is reflected up and out from the light pipe. The angle 25 extends from a first position 24.5*a* to a second position 24.5*b* and which is formed from this angled surface can be in the range of approximately 1-33 degrees depending on the dimensions of light pipe 24. Thus, when light pipe 24 is positioned inside of the housing, the angled surface extends from first position 24.5*a*, which is a position closer to light 60 to second position 24.5*b* which is farther from light 60 but closer to front face 14.1 than first position 24.5*a*. FIG. 12 also shows the longitudinal axis 99*d* of light pipe 24 which extends parallel or substantially parallel with line 25*a* and also parallel or substantially parallel to front face 14.1. With both longitudinal axes 99*c* and 99*d* these axes extend along the length or the longest dimension of these light pipes.

Figure 14:
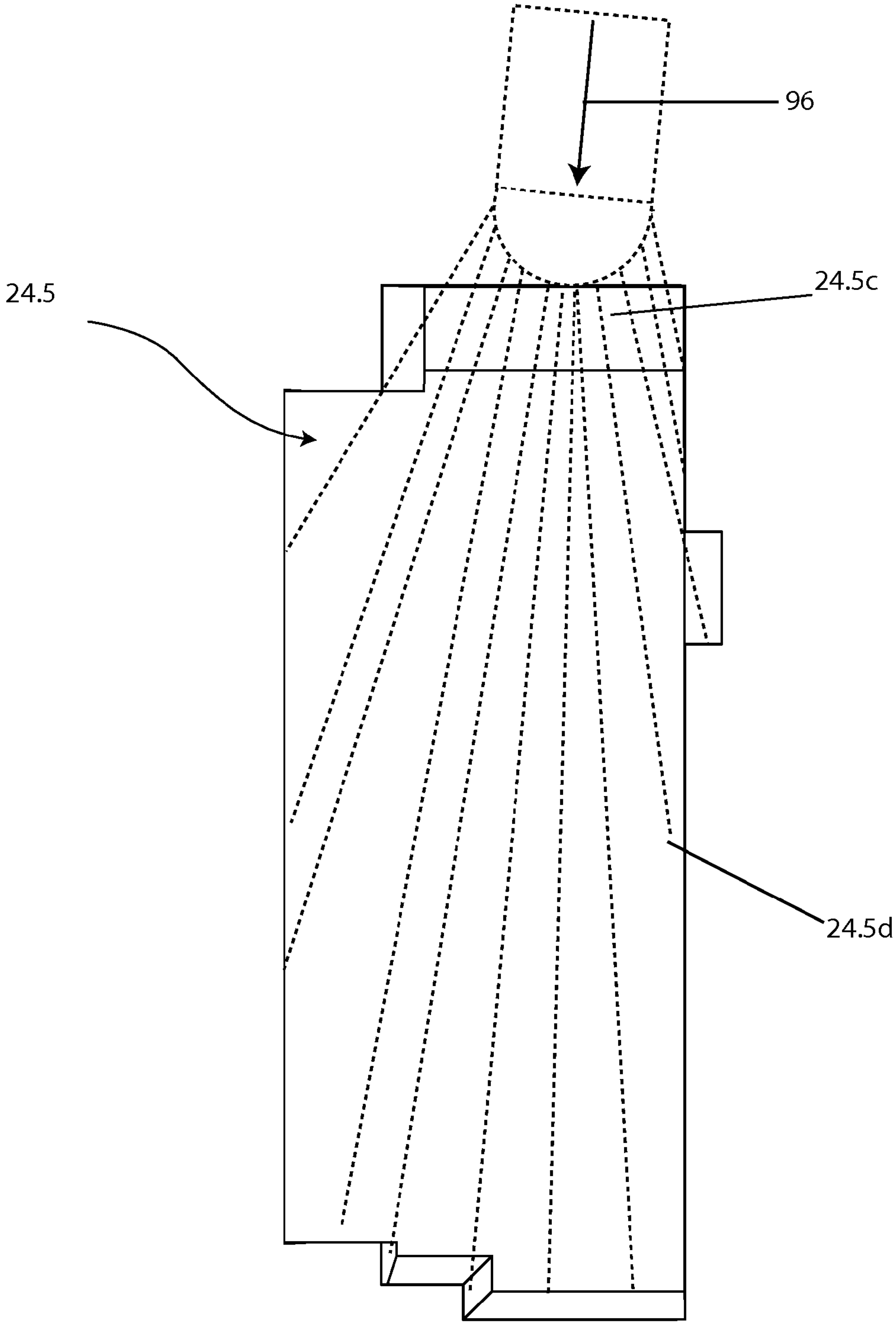
FIG. 14 is a back view of the right light pipe shown in FIG. 3.

FIG. 14 shows a back surface 24.5 having two different surfaces 24.5*c* and 24.5*d* wherein surface 24.5*c* is flat or substantially flat, while surface 24.5*d* is an angled reflective surface. Reflective back surface 24.5*d* is configured to allow light which shines into the light pipe to be reflected up and out of the light pipe. In at least one alternative embodiment, this surface is not reflective. FIG. 14 also shows a light such as light 50 or 60 having a light source which is positioned at an end surface such as end surface 22.3 or 24.3 (See FIGS. 6 and 11) which emits a radiation pattern into the associated light pipe 22 or 24. The radiation pattern forms a light beam area. As shown in this view, there is a peak radiation direction or axis shown by arrow 96 which shows the direction of the peak portion of this radiation line pattern. This peak radiation direction is configured to emit directly into the light pipe substantially along its longitudinal axis. The term substantially along the longitudinal axis means any amount of direction in line or within 30 degrees offset from the longitudinal extension or axis of the light pipe.

Figure 16:
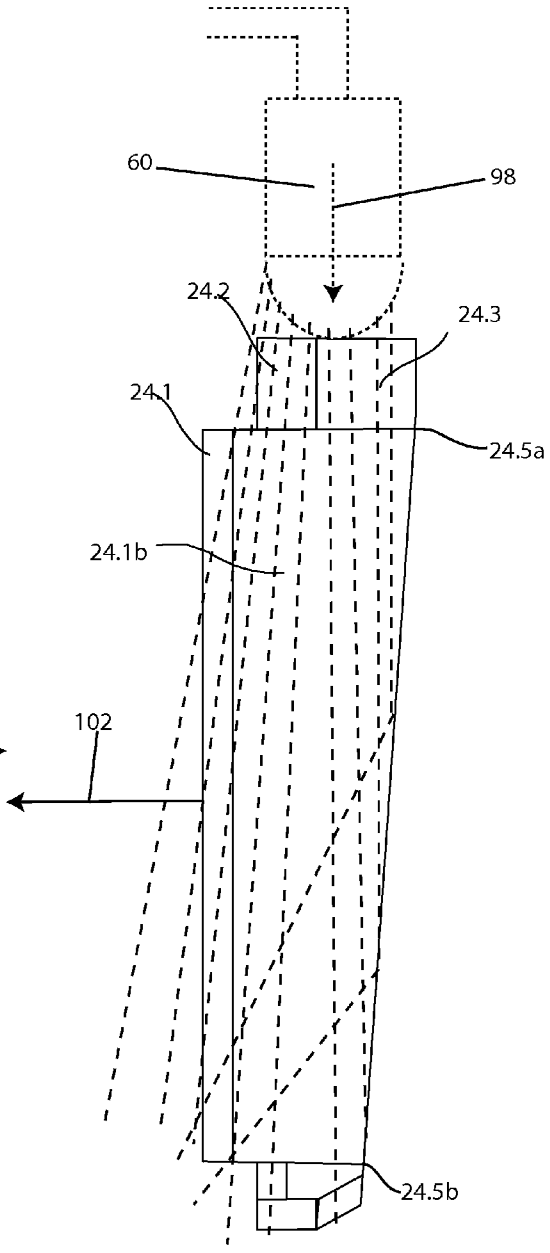
FIG. 16 is a view of a light and second light pipe combination showing a radiation pattern.

FIGS. 15 and 16 show light pipes 22 and 24 positioned adjacent to lights 50 and 60 which shows the configuration of these light pipes and lights once the device is assembled. This view shows examples of basic light emission lines extending and reflecting inside of the light pipe, and thereby extending outside of the light pipe as well to show emitted light. In at least one embodiment, at least one of light pipes 22 and 24 is translucent, and made from a frosted acrylic material which absorbs light from LED 50 or 60 and then emits this light from the associated light pipes 22 and 24. Lights 50 and 60 each comprise a light source which emits light in a radiation pattern as shown by the dashed lines. This radiation pattern has a peak radiation direction extending along an axis shown by arrows 97 and 98 which extend substantially parallel to the longitudinal axis the light pipes or at least along the longitudinal extension of light pipes 22 and 24 and wherein this peak radiation direction 97 extend substantially parallel to front face 14.1. As described above, the term "substantially" or substantially parallel means either in line with, parallel to, or offset not more than 33 degrees from that axis. Because of the respective internally reflective surfaces 22.5 and 24.5, (See FIGS. 9 and 14) the light radiation patterns can then be reflected outside of each respective light pipe 22 and 24, in a desired emission direction such as shown by arrows 101 and 102. This desired emission direction can then be transverse, substantially transverse, perpendicular, or substantially perpendicular to the peak radiation direction of the light. In at least one embodiment the term "substantially parallel to" comprises not more than 30 degrees offset from an axis parallel to the front face 14.1 of the housing, in another embodiment, the term "substantially parallel to" means not more than 20 degrees offset from an axis parallel to the front face 14.1, in another embodiment the term "substantially parallel to" means not more than 10 degrees offset from an axis parallel to a front face 14.1, while in another embodiment "substantially parallel to" means not more than 5 degrees offset from an axis parallel to a front face 14.1

One of the benefits of this type light pipe is that this light translation allows lights to be positioned in any desired direction inside of a housing. This allows for the positioning of lights such as LED lights into a housing having space constraints, allowing for additional electronic components to be fit into the housing. Another benefit is that because much of the light radiation inserted into the light pipe is internally reflected from a point inside the light pipe to outside of this light pipe, the light pipe can provide the appearance of a substantially uniform source of light with few, or no detectable peak radiation points.

FIG. 17 shows a front or plan view of the device which includes light pipes 22 and 24, middle housing 12, lights 50 and 60 reset button 90 and test button 92. In addition, at least one and in this embodiment a plurality of tamper resistant shutters 80 are disposed inside the housing. Examples of tamper resistant shutters include those shown in U.S. Pat. No. 7,455,538 which issued on Nov. 25, 2008, and U.S. Pat. No. 7,551,047 which issued on Jun. 23, 2009. The disclosure of both patents are hereby incorporated herein by reference in their entirety. Another example of a shutter type design is U.S. Pat. No. 7,651,347 which issued on Jan. 26, 2010 the disclosure of which is hereby incorporated herein by reference in its entirety.

Lights 50 and 60 can be in the form of any suitable light. In this embodiment there are shown two different LED lights, with a first light 50 and the second light 60 being positioned to extend and to project light in a plane substantially parallel with front face 14.1 of housing 14. Each light 50 or 60 is positioned to form an L-shaped or substantially L-shaped electrical connection with an underlying circuit board (See FIG. 24).

Tamper resistant shutters 80 are shutters configured to restrict the access of outside elements or foreign objects into an interior section of the housing where electrical contacts are located. In at least one embodiment, the shutters are configured to move axially, in the direction of arrow lines 88 and 89, and to be biased in a closed direction via a spring (See FIG. 24.). However, these shutters are optional and the axial movement of the shutters is also optional. Other movements can be incorporated to restrict access to the electrical contacts.

These tamper resistant shutters 80 include a first tamper resistant shutter 82 and a second tamper resistant shutter 86. First tamper resistant shutter 82 includes a frame **82*a*, which forms a body for a ramp section 82*b*, an opening 82*c* and a closed section 82*d*. Second tamper resistant shutter 86 includes a frame 86*a*, which forms a body for ramp section 86*b*, an opening 86*c* and a closed section 86*d*. These tamper resistant shutters are biased in a closed position such that the closed section 82*d* and 86*d* form a blocking surface behind neutral blade openings 31 and 36 (See FIG. 2). In addition ramp, section 82*b* and 86*b* is positioned behind phase blade openings 32 and 37. When a user inserts a plug having two blades, each having ends of substantially the same length, this provides pressure on the shutter causing the axial motion of the plug to translate into substantially perpendicular axial motion in the direction of arrows 88 and 89**.

First shutter 82 is biased in a closed position via spring 83 which can be any type of spring but in this embodiment is a coil spring wrapped around post 84. Second shutter 86 is biased in a closed position via spring 85 which can be any type of spring such as a coil spring wrapped around post 87. Posts 84 and 87 are positioned in a peripheral region of the housing adjacent to the side walls to provide room for the additional components such as the lights and light pipes. When the shutters are moved into an open position, allowing the plug to insert, the springs 83 and/or 85 are compressed or coiled further. When the plug is removed from the associated socket, the springs snap the shutter back to a closed position.

Due to the space constraints relating to all of these features inside of a single housing such as a single gang enclosure, the LED lights and light pipes are positioned so as to reduce the amount of space taken by these lights while maximizing the amount of light emitted out of these light pipes. For example, along with the presence of the shutters, with a fault circuit interrupter, such as a ground fault circuit interrupter, there is also a reset button 90 and test button 92, movable contacts, a circuit board 59, and a plurality of sensors disposed inside of this housing. (SEE FIG. 24). In addition, there are sensors coupled to the circuit board as well wherein at least one sensor is configured as a light sensitive sensor along with a switch which is configured to selectively turn on or off lights 50 and 60 depending on an amount of ambient light. This design also includes an optional additional photodiode 15 which is positioned adjacent to light 50 and which is configured to read any input of light into light pipe 26 (See FIG. 22). Alternatively light 50 can be selectively switched on and off to selectively emit light out from light pipe 26 as well.

Figure 18:
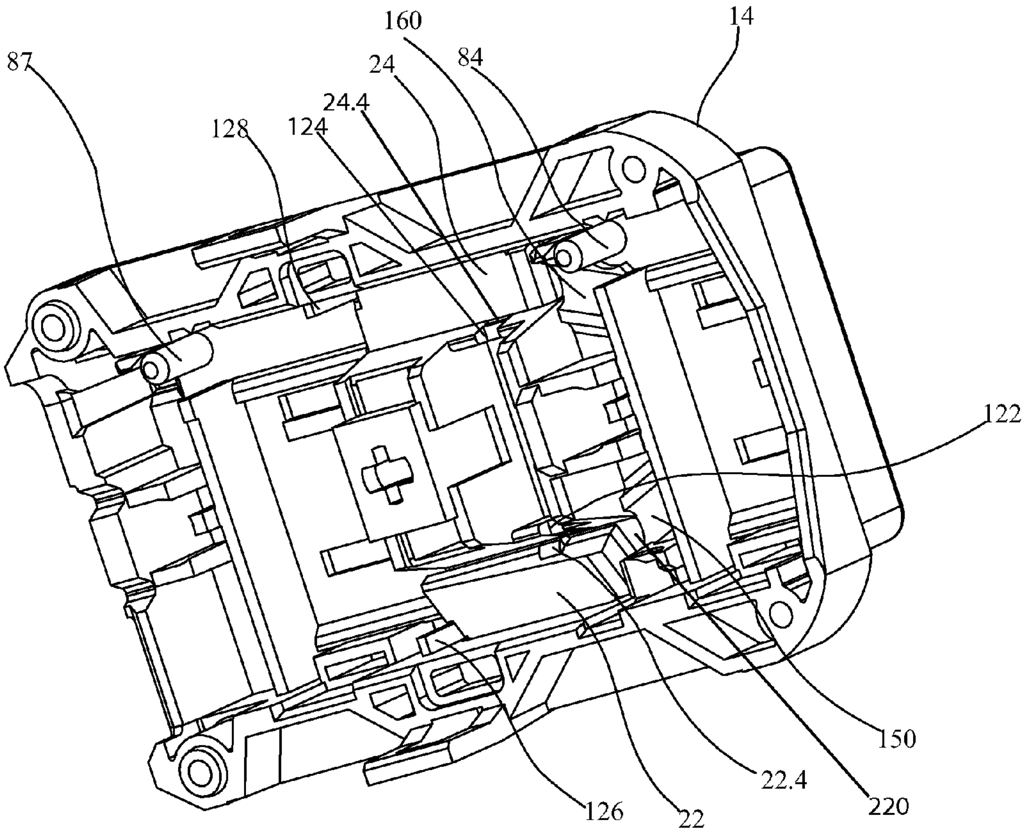
FIG. 18 is a back side view of the front cover.

FIG. 18 is a bottom perspective back view of front cover 14 with a first light pipe or left light pipe 22 being snapped into cover 14, and with another light pipe 24 already being snapped in place. In this view, there is a post 126 which is configured to assist in locking light pipe 22 therein, wherein tab 22.4 extends out from a lateral side of light pipe 22. When light pipe 22 is snapped into its locked position, tab 22.4 snaps into opening 122 to keep this light pipe locked in place. For example, light pipe 24 which is snapped in place has tab 24.4 (See FIG. 18) snapped into opening 124. Disposed substantially opposite these tabs, posts 126 and 128 are configured to also assist in locking these light pipes 22 and 24 in place. In addition, cover 14 also contains recesses or slots 150 and 160 which can be in the form of substantially cylindrical recesses which are configured to hold lights such as LED lights 50 and 60 in place. For example, when cover 14 is placed on middle cover 12, recess 150 is positioned over light 50 while recess 160 is positioned over light 60. Because these recesses are substantially cylindrical, and essentially wrap around this light they form both a support surface and a reflective surface directing light forward into the adjacently positioned light pipe.

Figure 19:
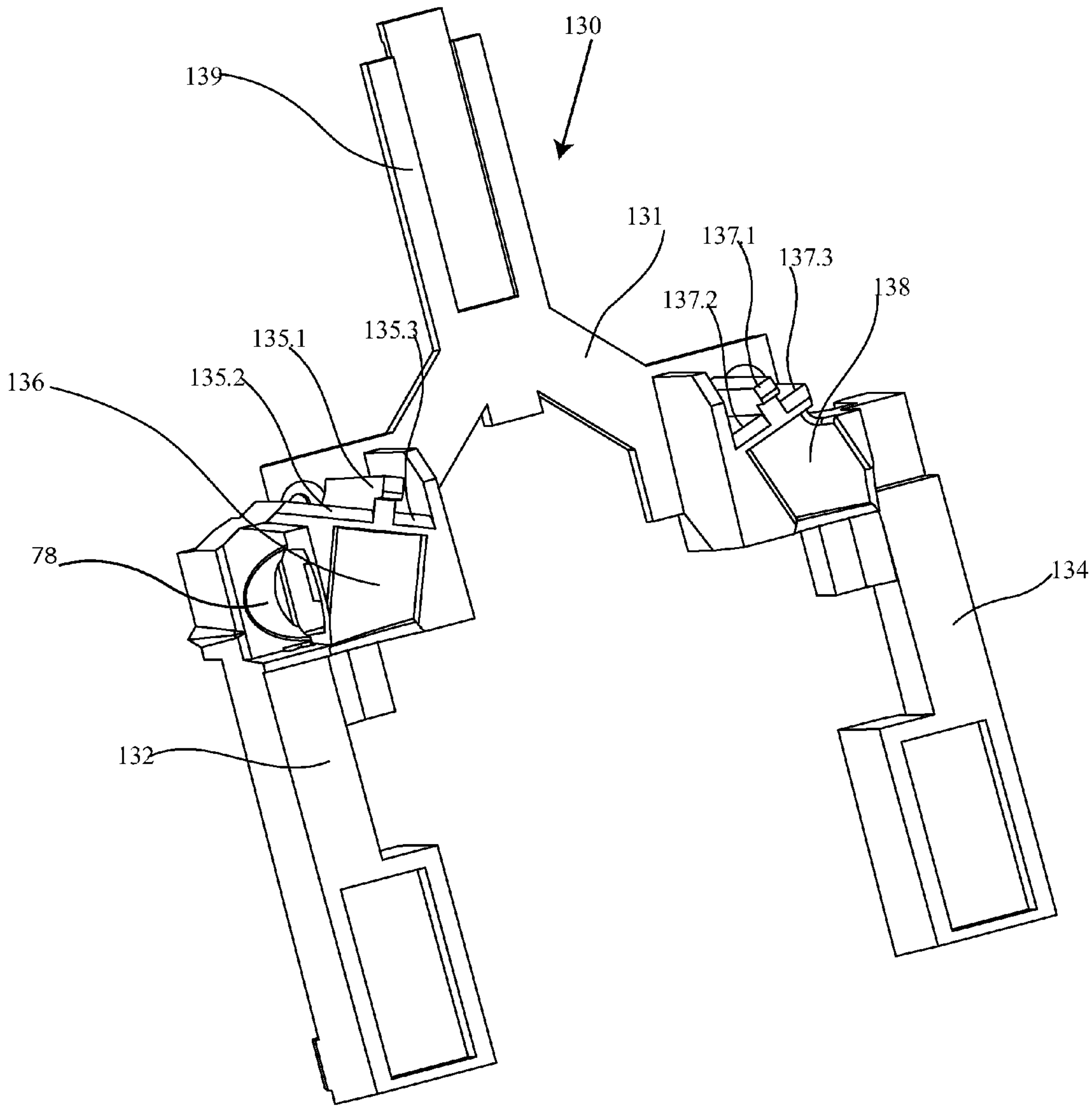
FIG. 19 is a front perspective view of a support piece disposed inside of the housing shown in FIG. 1.

FIG. 19 is a molded block 130 of supporting surfaces which are positioned inside of the housing. This molded block can be any suitable shape, however in this example, is Y-shaped or substantially Y-shaped. There is a body section 131, and arms 132 and 134. Arms 132 and 134 are configured to support the light pipes 22 and 24 respectively inside of the housing and include a support surface dimensioned to support back surfaces 22.5 and 24.5 in an angled manner. In addition, a plurality of recesses 136 and 138 are positioned inside of this support block 130, and opposite corresponding recesses 150 and 160. Therefore, when the device is assembled, light 50 is disposed between support block 130 and cover 14 wherein light 50 rests in recess 136 and recess 150, while light 60 rests in recess 138 and recess 160. This view also shows tongue 139, and also posts 135.1 and 137.1. Post 135.1 divides two tracks or gaps 135.2 and 135.3 for receiving electrical connections associated with light 50. In addition, post 137.1 divides two tracks or gaps 137.2 and 137.3 for receiving electrical connections associated with light 60. This molded block can also include a notch or cut out 78 for receiving a photodiode sensor.

Figure 20:
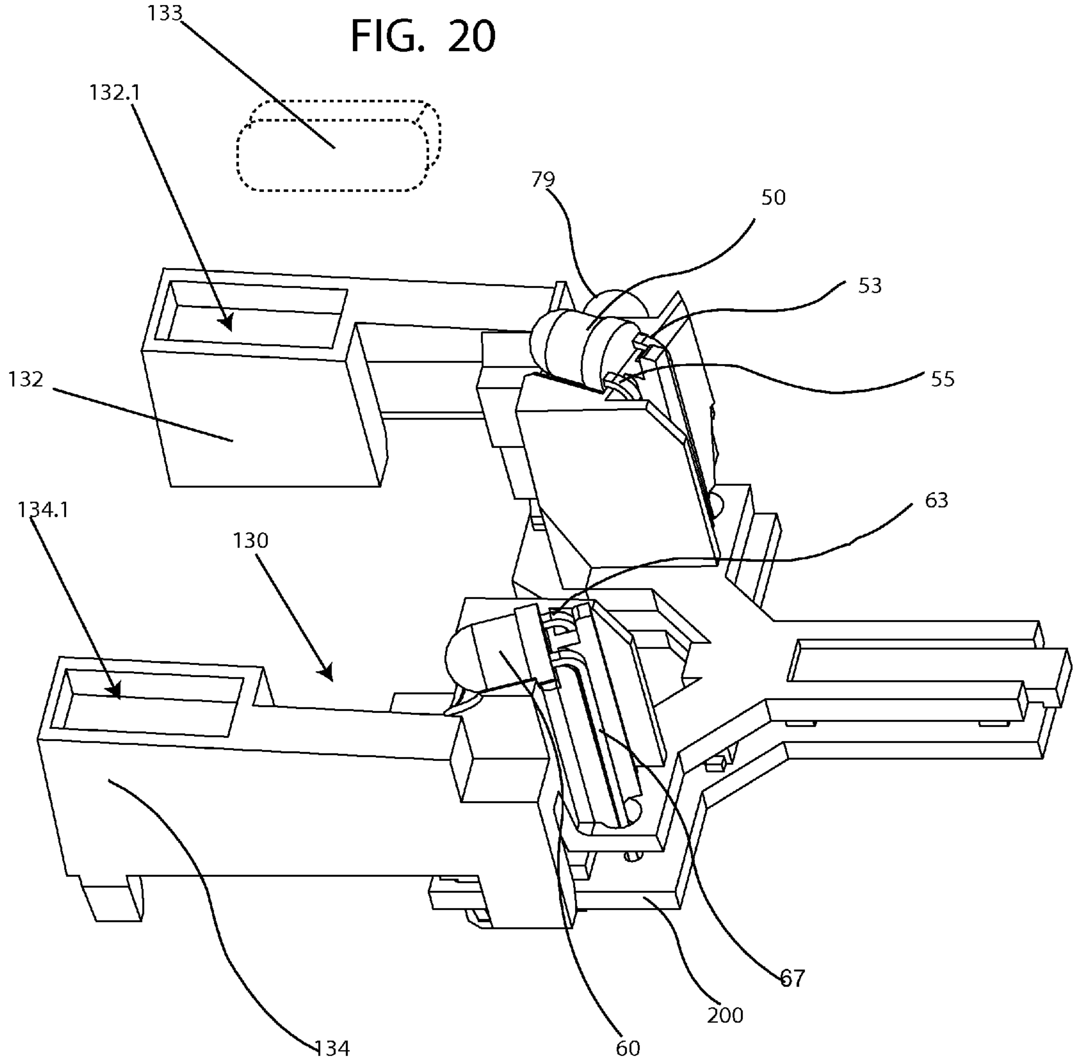
FIG. 20 shows a side perspective view of the support piece shown in FIG. 19.

FIG. 20 shows a side view of this support surface 130, which shows arms 132 and 134 which are formed ramp shape and which are configured to support associated light pipes 22 and 24 in an angled manner. In addition, there are lights 50 and 60 shown supported in recesses 136 and 138, with light lead lines 53 and 55 associated with light 50 extending down tracks 135.2 and 135.3 to an associated circuit board, such as for example circuit board 200. In addition light lead lines 63 and 67 extend down tracks 137.2. and 137.3 (See FIG. 19) to circuit board 200 as well. Circuit board 200 includes connections to these lead lines as well as connections to at least one light sensor, configured to selectively turn on or off lights 50 and 60 depending on the amount of ambient light and also includes a power or driver circuit which is configured to take power from either another circuit board such as circuit board 200 or directly from contacts 16*a*, 16*b*, to power the lights. The sensor selectively connects or disconnects power between the driver circuit and the associated lights 50 and 60. This view also shows photodiode sensor 79 which is positioned in notch 78. In addition, there are optional cut outs 132.1 and 134.1 which are configured to receive a flexible or spongy material such as an optional flexible or spongy block 133. Flexible or spongy block(s) 133 can be inserted into any one of cut outs 132.1. and 134.1 and are used provide a springy surface for supporting a light pipe, allowing the light pipe to be fit snugly into the housing.

While one embodiment includes this spongy material, Other embodiments do not include this spongy material.

In addition, support element 130 is configured, particularly posts, 135.1 and 137.1 and associated tracks 135.2 and 135.3 and 137.2. and 137.3 so that it allow for simple manufacturing design. For example, during manufacture, a LED can be secured to a circuit board such as circuit board 200 with lead lines 53 and 55 and 63 and 67 being soldered or otherwise connected to circuit board 200. The associated lights 50 and 60 can then be simply laid into recess 136 or 138 without any additional configuration. Therefore, the steps for manufacture would include coupling a LED to a circuit board and then providing a support block inside of a housing having a predetermined size such that it supports the already mounted LED. Thus, on optional design, the predetermined sizing of the support 130 is a predetermined size of the posts 135.1 and 137.1 and the associated tracks 135.2, 135.3 and 137.2 and 137.3. The sizing of the tracks is substantially similar to the length of any lead lines such as lead lines 53, and 55 or 63 and 67 from associated lights 50 and 60. The end result is that there is little or no slack in the lead lines which would cause any interference or inadvertent shorting of these lines because these lines would be both divided by their respective posts 135.1 and 137.1 and be held in a taut or at least substantially taut manner.

Figure 21:
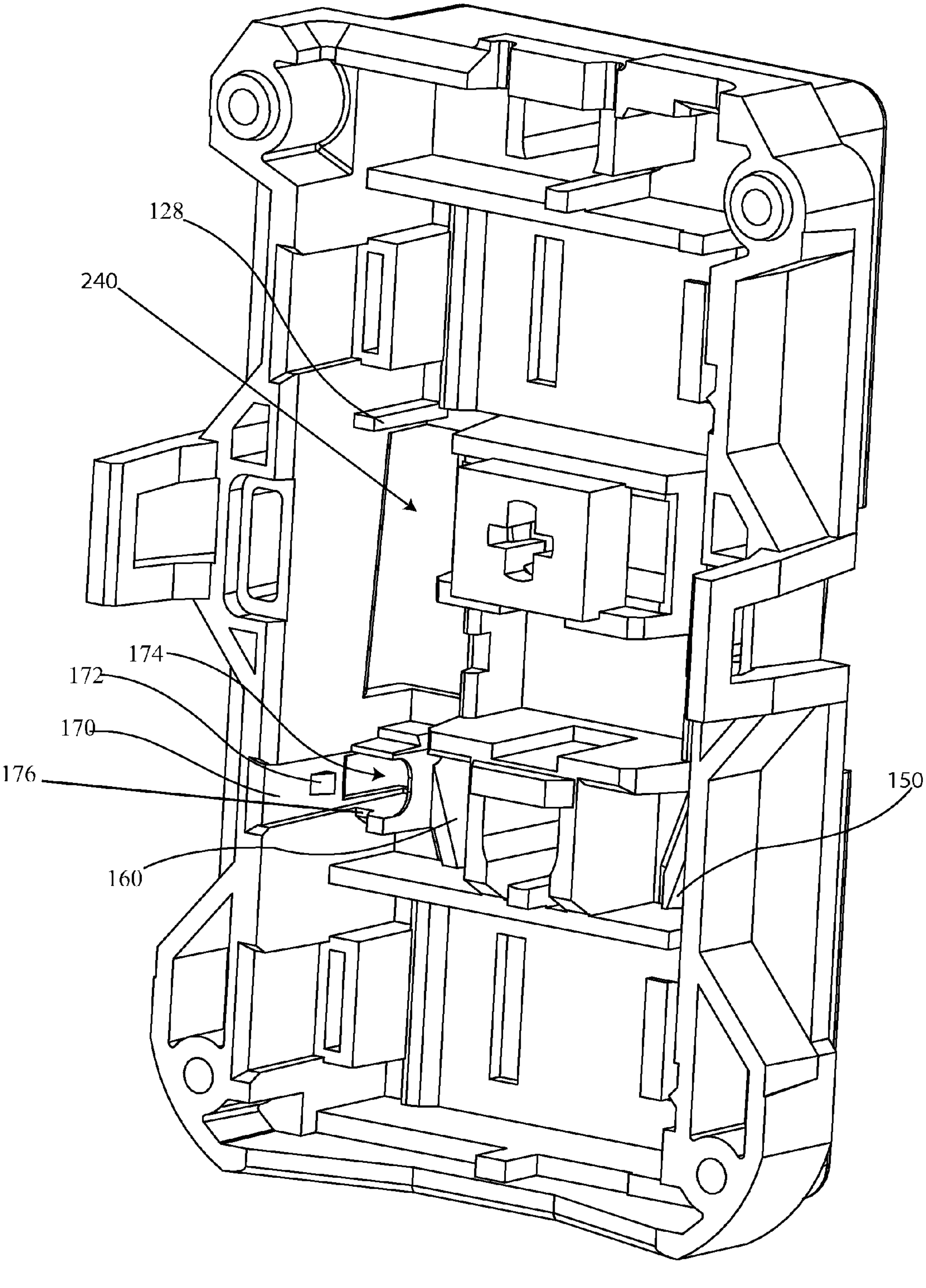
FIG. 21 is a back perspective view of the inside surface of the front cover shown in FIG. 1.

FIG. 21 is another back perspective view of the cover 14 which shows post 128 as well as recess 160 and an additional recess 170. Additional recess 170 is configured to receive additional light pipe 26. Recess 170 includes a tab 172 and a hole 174. Tab 172 acts as a protrusion which is configured to extend into light pipe 26 to lock it in place. In addition recess 170 also includes an opening or a hole 174 which allows light pipe 26 to extend out flush with cover 14 and forms an opening to allow light to shine through. There is also a rim 176 which is configured to receive an arm of light pipe 26 which extends around light pipe 26. This view also shows an opening 240 in face 14 which is configured to let light pass from to housing and out from light pipe 24. In addition an opposite spaced opening 220 is shown in FIG. 18.

Figure 22:
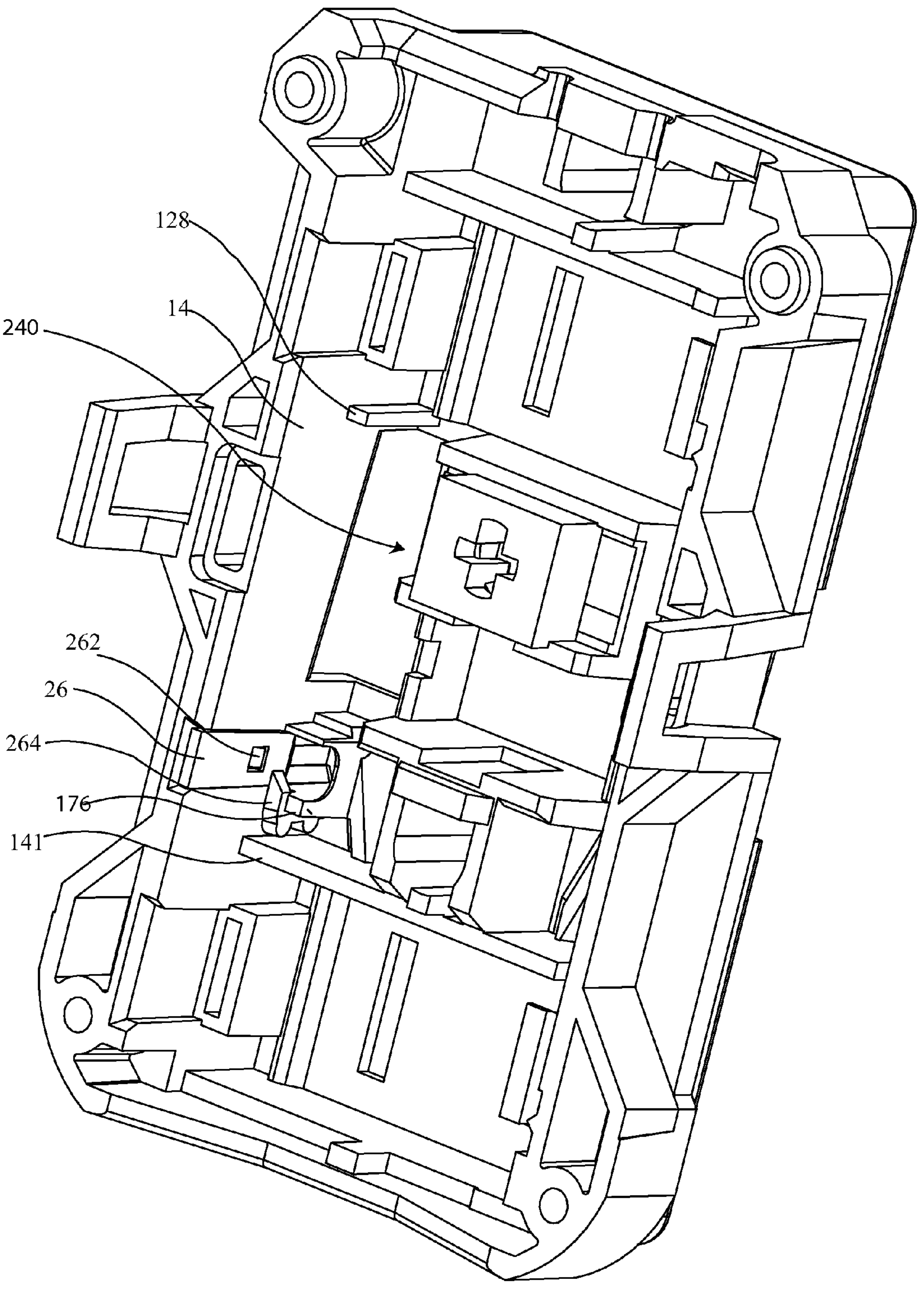
FIG. 22 is another back perspective view of the front cover with the light pipe being inserted.
Figure 23:
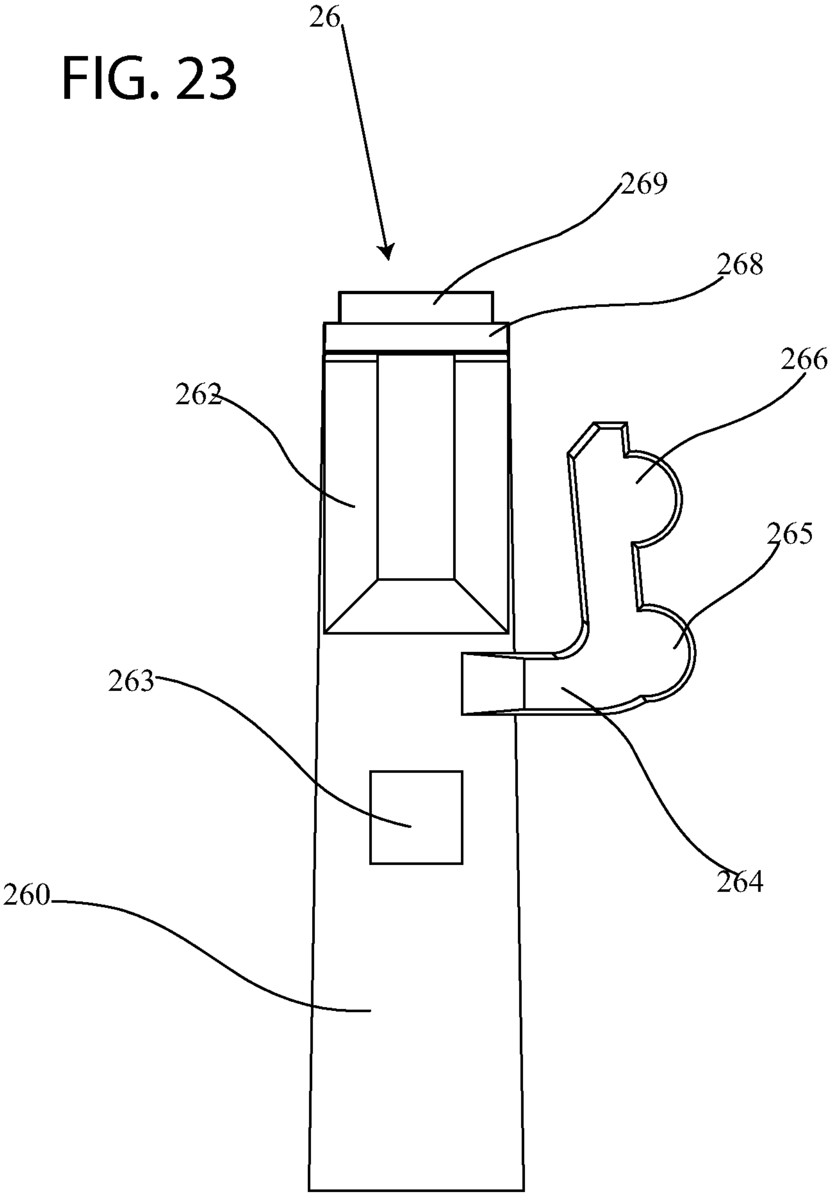
FIG. 23 is a side view of a light pipe shown in FIG. 1.

FIG. 22 shows light pipe 26 snapped into recess 170. In this view, there is shown a wall 141 which isolates a sliding latch section from a light pipe section inside of the housing. FIG. 23 shows an internal view of this light pipe 26, which as shown in FIG. 1 is a L-shaped light pipe. In this view there is a light pipe body 260, a light emitting region 262 extending along a lateral side of cover 14. In addition, there is also a securing arm 264 which is configured to lock light pipe 26 in place with arm 264 wrapping around rim 176. Arm 264 includes at least two protrusions 265 and 266 which extend out from this arm and which extend towards wall 141. Based upon this view, arm 264 can bend or move in a clockwise-counter clockwise springing motion when the light pipe is snapped into place. If the light pipe is moved to pop out from recess 170, these protrusions bump against wall 141 to keep this arm locked in place. Light pipe 26 also includes an additional face or surface 268 which extends substantially perpendicular to light emitting region 262. This additional face or surface 268 includes an additional extended surface 269 extending out from surface 268.

Figure 24:
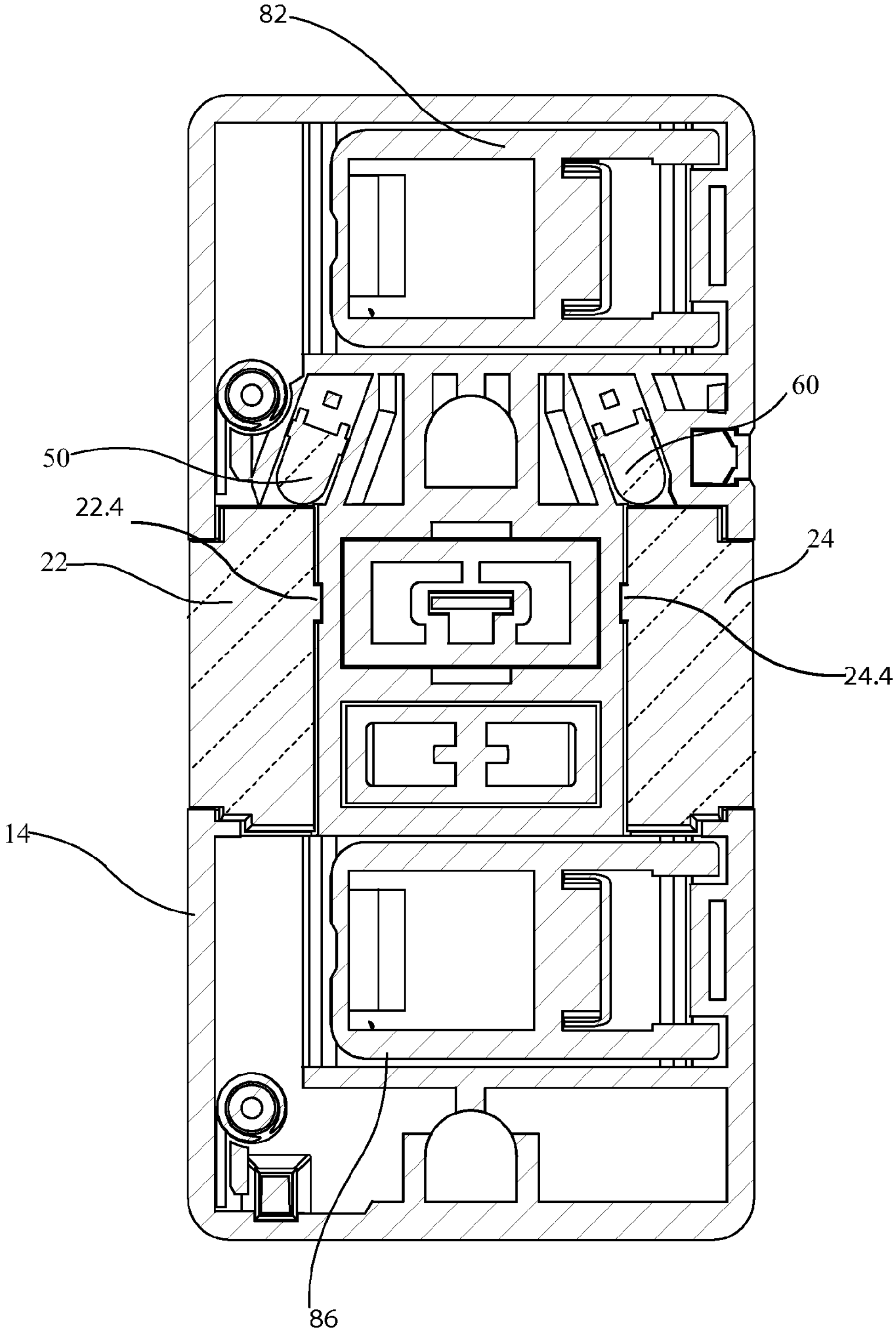
FIG. 24 is a cross-sectional view of the electrical device shown in FIG. 1.

FIG. 24 shows a back cross-sectional view of the device which shows cover 14, lights 50 and 60 disposed in a nested position in the cover, and disposed adjacent to corresponding light pipes 22 and 24, such that light 50 is disposed adjacent to light pipe 22 and light 60 is disposed adjacent to light pipe 24.

Figure 25:
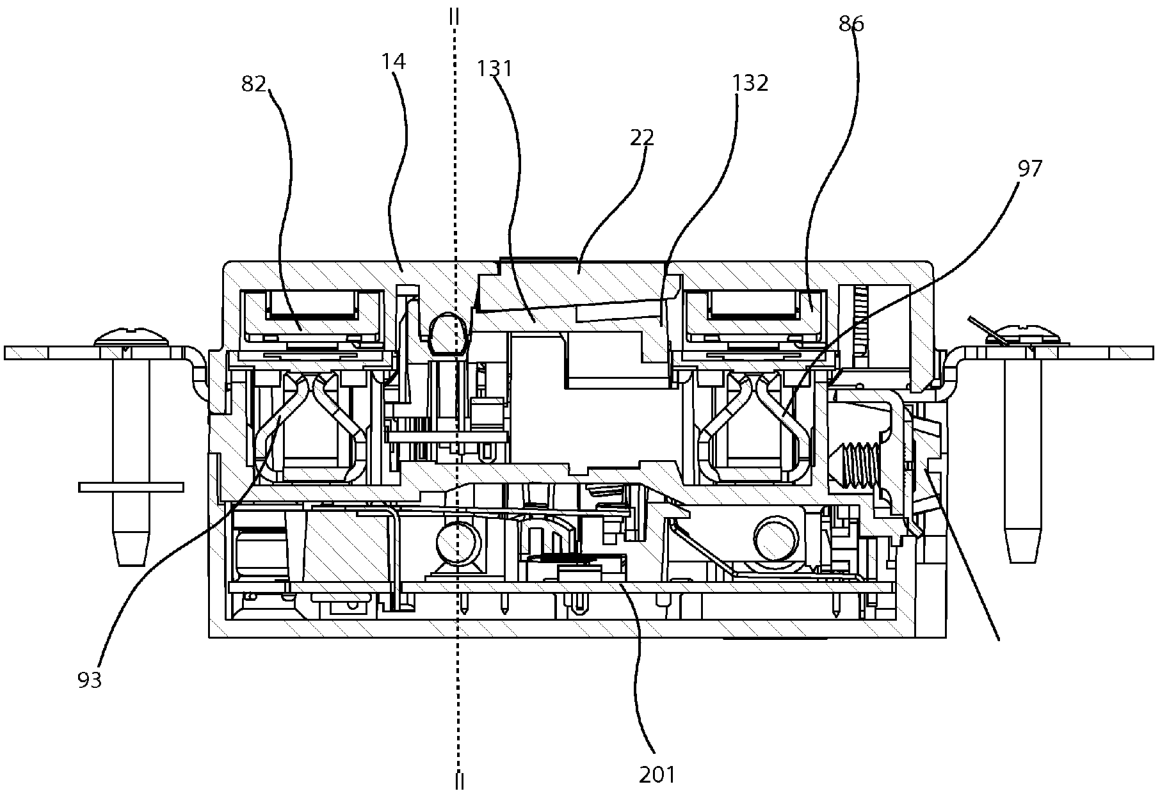
FIG. 25 is another cross-sectional view of the electrical device shown in FIG. 1 taken along the line I-I in FIG. 26.
Figure 26:
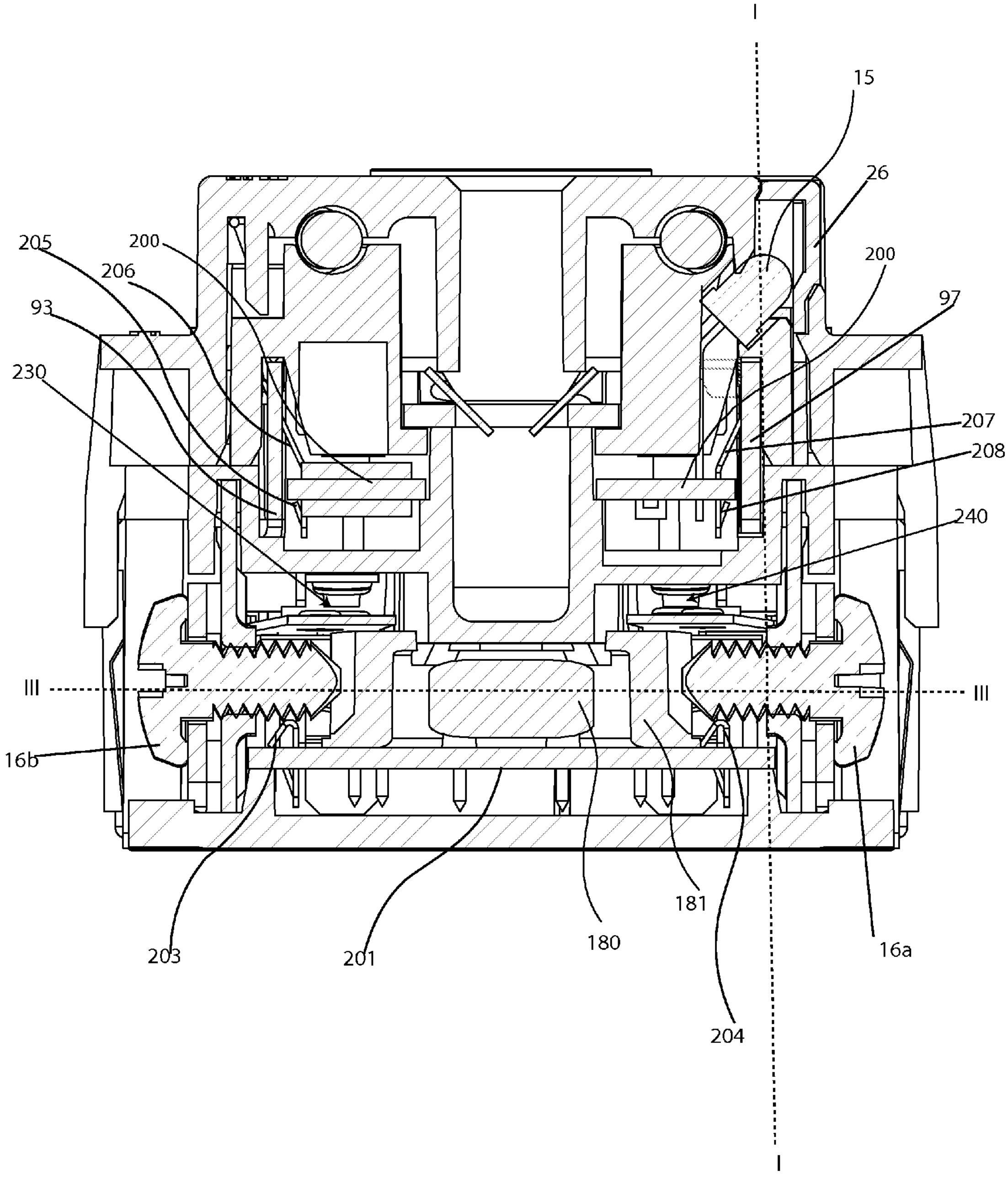
FIG. 26 is a cross sectional view of the electrical device of FIG. 1 taken along the line II-II in FIG. 25.

FIG. 25 shows a side cross-sectional view of the device taken along the line I-I of FIG. 26. This view shows shutters 82 and 84 which are disposed in front of contacts 93 and 97, forming prong contacts for contacting with prongs of a plug. When the electrical device is connected to a power source such as by connecting distribution wiring to contacts 16*a* and 16*b*, these prong or face contacts would then selectively receive power based upon whether a set of movable contacts are in a closed or latched position. A set of contacts 230 are shown in an open position.

In addition, light pipe 22 is positioned situated on top of leg 132 of support surface 130, wherein leg is formed in an angled manner providing the angled surface for light pipe 22. In addition, this view also shows base circuit board 201 which is configured to house sensors, and other electrical components relating to the optional fault circuit or other optional features.

FIG. 26 shows a side cross-sectional view of the device taken along the line II-II of FIG. 25. This view shows contacts 230 and 240 which are positioned in an unlatched or open position. In addition this view shows first circuit board 200 positioned spaced apart from second circuit board 201. As described above, second circuit board houses sensors 180 and 190 (not shown) inside of a sensor housing 181 and provides power and switching instructions to contacts 230 and 240 of the optional fault circuit. In addition, contacts 16*a* and 16*b* are also shown which are used to provide power to circuit board 201 via power contact lines 203 and 204. In addition circuit board 200 is powered from lead lines 205 and 206 which connect to face terminals such as face terminals 93. Face terminal 93 also has lead lines 207 and 208 coupled thereto to power circuit board 200 as well. This view also shows photodiode 15 which is configured to sense light through additional light pipe 26 wherein this photodiode forms a sensor for detecting ambient light outside of the housing.

Figure 27:
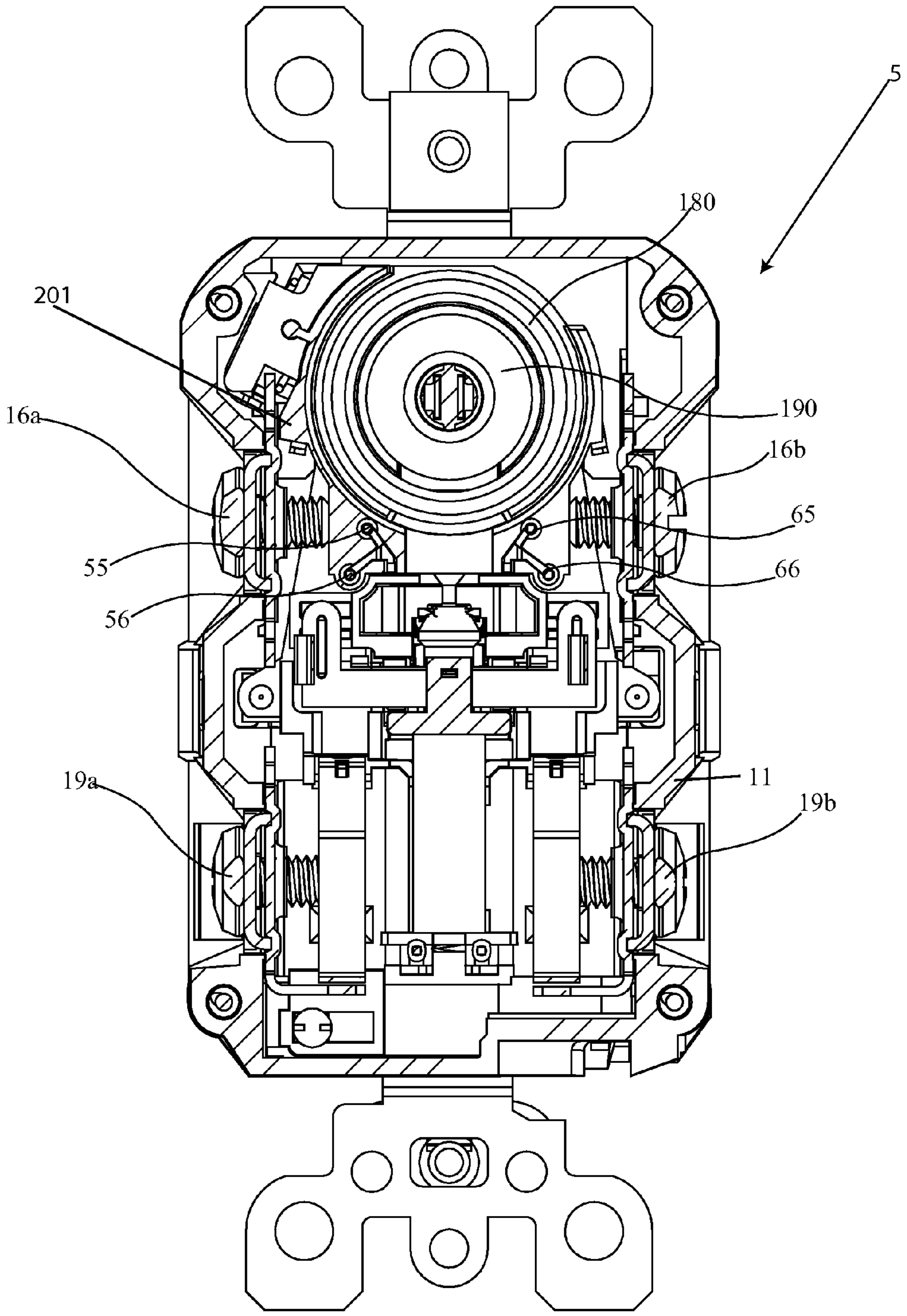
FIG. 27 is a back-cross-sectional view of the device taken along the line.

FIG. 27 is a back cross-sectional view taken along the line III-IIIa type of electrical device of FIG. 1. This device that can be used with these light pipes, shows a plurality of transformers 180 and 190 positioned in a nested or concentric configuration and disposed inside of the back cover 11. In addition, this view shows circuit board 201 which includes contact points 55, 56, 65, and 66 which are configured to connect to sensors 180 and 190. As with standard fault circuit interrupters, when any one of sensors 180 or 190 detect a fault, this fault is indicated to a sensor circuit disposed on circuit board 201. The sensor circuit then determines whether to disconnect contacts 230 or 240, which would then isolate load contacts 19*a* and 19*b* from input contacts 16*a* and 16*b*. In addition, in this disconnected state prong or face contacts such as contacts 93 and 97 (See FIG. 25) are also disconnected from power.

Figure 28:
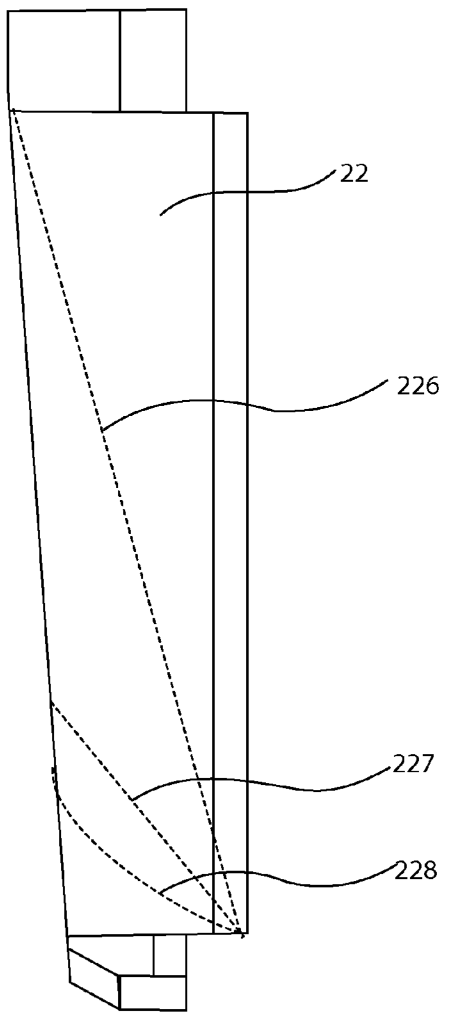
FIG. 28 shows a view of different embodiments for a left light pipe.
Figure 29:
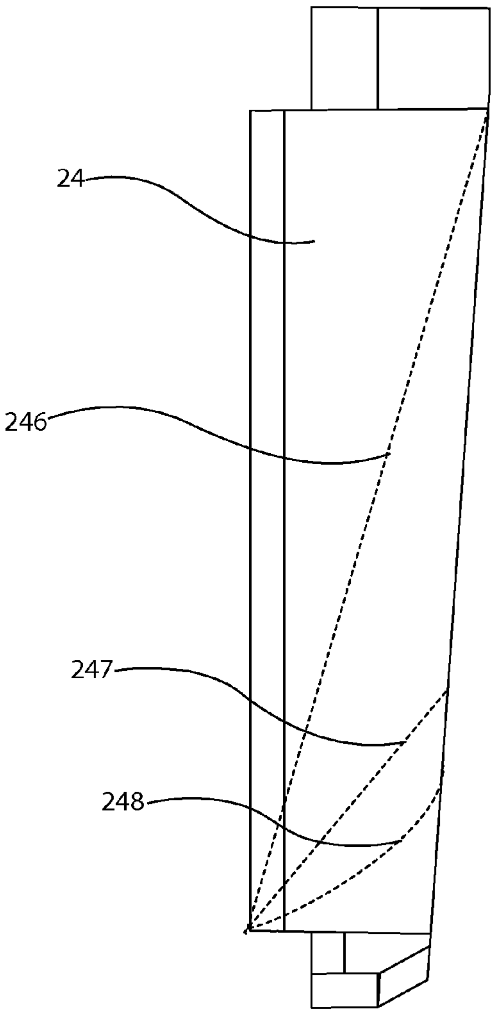
FIG. 29 shows a view of different embodiments for a right light pipe.

FIGS. 28 and 29 show multiple different side view of different embodiments of light pipes 22 and 24. For example, FIG. 28 shows a side view of a light pipe such as for example light pipe 22. This view shows other internally reflective surfaces that can be used such as surface 227 which is at an angle greater than the angle formed for internally reflective surface 22.5 that is shown in FIG. 7. In another embodiment, element 228 shows another angled internally reflective surface which starts at an intermediate point of angled surface 22.5 and extends at a steeper angle. In addition in another embodiment, there is also another internally reflective surface 229 which is shown parabolic in shape.

FIG. 29 also shows different designs, wherein one design shows internally reflective surface 247 which extends at an angle greater than that shown in FIG. 12. In addition, in another design element 248 shows another angled internally reflective surface which starts at an intermediate point of angled surface 24.5 and extends at a steeper angle. In addition there is also another design which shows a parabolic or curved internally reflective surface which is used to reflect light internally inside the light pipe. Each of these internally reflective surfaces are can be formed by a roughened outer surface, the properties of the material itself, or via a coating on the surface, or simply a reflective surface applied to the outer surface of a light pipe or fiber optic, or positioned adjacent to the outer surface of the light pipe or fiber optic.

Figure 30:
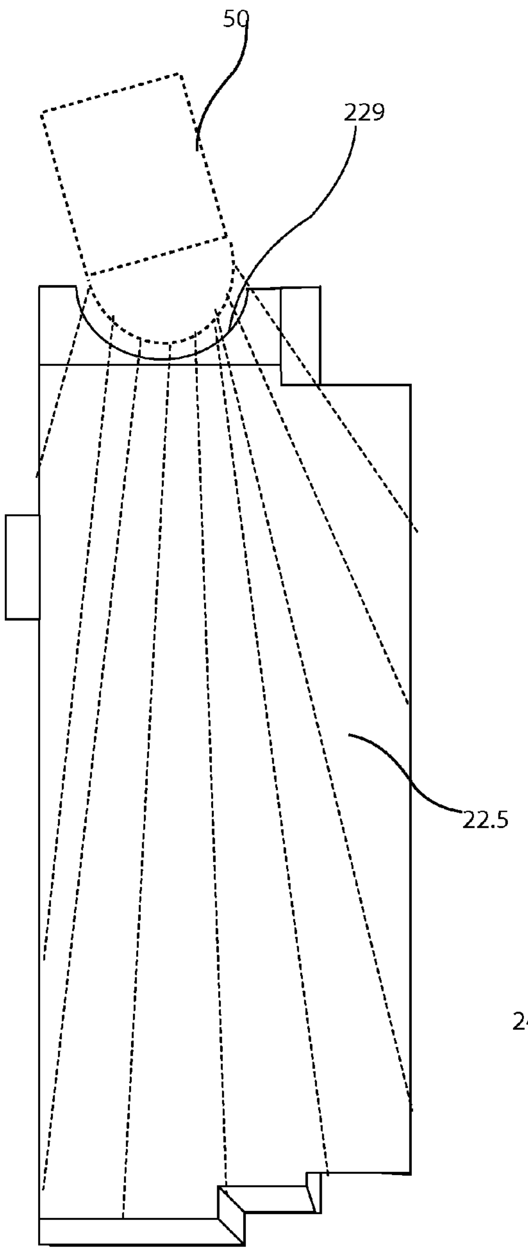
FIG. 30 shows a back view of an alternative design for a left light pipe.
Figure 31:
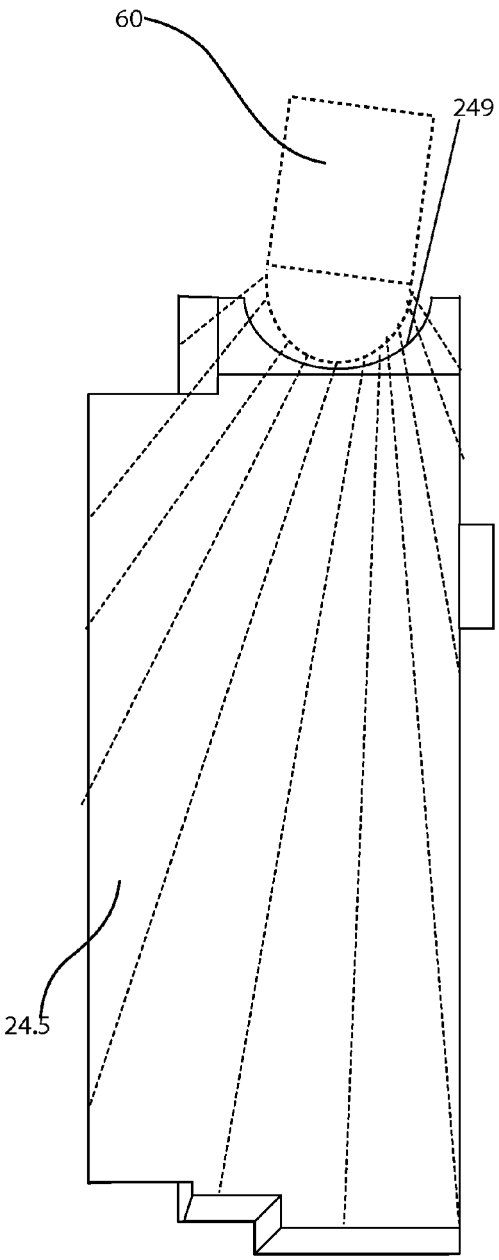
FIG. 31 shows a back view of an alternative design for a right light pipe.

FIG. 30 shows another design which shows a back view of a light pipe such as left light pipe 22 with a cut out or curved receiving region 229 which is configured to receive a light or light body such as LED light 50. In addition, FIG. 31 shows another design for right light pipe 24 which shows a cut out region or curved interface 249 which is configured to receive light 60. These curved surfaces or interfaces allow for the seating of an associated light, which then is used to incorporate more light into the light pipe for further reflection or refraction.

Figure 32A:
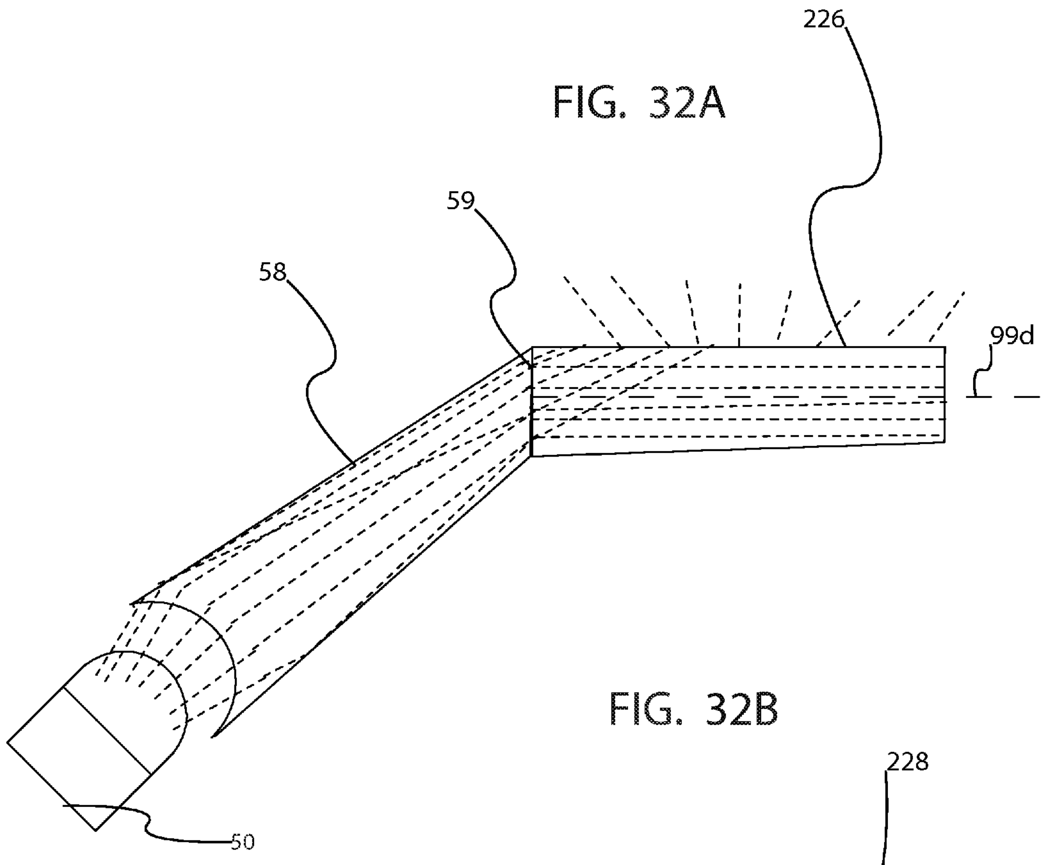
FIG. 32A shows an alternative embodiment.

FIG. 32A shows an alternative design which shows LED light 50 acting as a light source which is directed into a fiber optic 58 which is configured to internally reflect light along the path of this fiber optic and into light pipe 226 at interface 59. This fiber optic acts as a waveguide having outer surfaces that are internally reflecting and which are used to guide the light to the interface without substantial loss. At interface 59, this fiber optic forms a light source which projects light into the light pipe 226. Thus, a first light source 50 can be spaced apart from light pipe 226 and also be positioned at any desirable angle while also forming a light source at interface 59 while still having a substantial portion of the light extending along the longitudinal axis 99*d* of the associated light pipe.

Figure 32B:
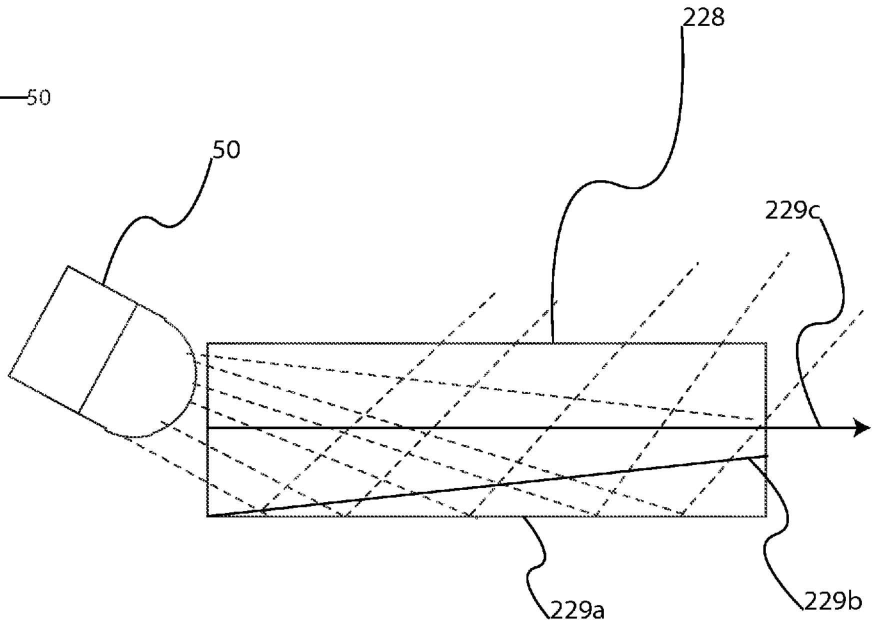
FIG. 32B shows another embodiment

FIG. 32 B shows an alternative design with a light 50 forming a light source which is configured to project a light into a light pipe 228. The light pipe 228 can be formed having a substantially rectangular cross-sectional surface area, with a first type of back surface 229*a* which extend substantially parallel to a longitudinal axis 229*c* of the light pipe and also substantially parallel to a front surface 14.1 of the front face. Alternatively light pipe 228 can have an angled surface 229*b* which is angled relative to longitudinal axis 229 and angled relative to the front face 14.1 as well.

In any one of the above designs, the light source such as light 50, 60, or fiber optic face 59 and back surface such as back surface 22.5, 24.5 229*a*, or 229*b* are angled relative to this back surface so that a substantial portion of primary light is reflected back internally into the light pipe so as to create substantial internal reflection and sufficient and substantially even dispersion of light inside of the light pipe.

The term substantial portion of primary light could be any amount of light that is greater than 30%, greater than 50%, greater than 60%, greater than 70%, 80%, or 90%. The efficiency of this reflective surface is controlled by the optical properties of the material of the light pipe as well as the optical properties of the reflective surface itself.

With this nested configuration, a fault circuit interrupter has a plurality of sensors in a substantially shallow configuration such as that disclosed in International Patent application Serial No. PCT/US09/49840 filed on Jul. 7, 2009 the disclosure of which is hereby incorporated herein by reference. Therefore, with this type of electrical device, disposed in a compact housing, there is a substantial amount electrical components positioned in a single gang electrical enclosure having a shallow depth. For example, while these dimensions are not required, an example of the dimensions of the housing are as follows: overall height OH (See FIG. 26) at or up to 1.380 inches in a first embodiment; or not more than 1.4 in a second embodiment or .up to not more than 1.75 inches in a third embodiment. The overall width or OW (See FIG. 26) in a first embodiment is at or up to 1.73 inches, at or up to 1.75 inches in a second embodiment; or at or up to 1.9 inches in a third embodiment; overall length or OL (See FIG. 27) which is at or up to 2.7 inches in a first embodiment; at or up to 2.8 inches in a second embodiment or at or up to 3.5 inches.

With a shallow configuration of sensors, such as that shown in FIG. 27, the device can have an in box depth of at or up to 1.02 inches in a first embodiment. In other embodiments, the in box depth IBD, which is the depth from the strap 40 to the back of the electrical device (see FIG. 2) can be greater such as at or up to 1.2 inches or at or up to 1.5 inches.

An example of a decorator width which is the width of the visible face after installation of the device and which is shown by example by line 14.1*w* in FIG. 2 can be at or up to 1.28 inches in one embodiment, or at or up to 1.3. inches in a second embodiment, or at or up to 1.5 inches in a third embodiment. An example of a decorator length which is the length of the visible face after installation of the device which is shown by example by line 14.1L in FIG. 2 is at or up to 2.6 inches in a first embodiment, or at or up to 2.7 in a second embodiment, or at or up to 2.8 inches in a third embodiment.

Therefore, with this design, multiple electrical components, including a fault circuit interrupter, a duplex receptacle, a plurality of lights such as three separate lights coupled to or in connection with a plurality of light pipes, can be housed inside of a housing of limited space.

Accordingly, while a few embodiments of the present invention have been shown and described, it is to be understood that many changes and modifications may be made thereunto without departing from the spirit and scope of the invention as defined in the appended claims.

What is claimed is:

1. An electrical device comprising:

a) a housing having a front face;

b) a light source disposed in said housing, wherein said light source is configured to project a peak radiation pattern along an axis;

c) a light pipe having at least one angled surface, wherein said light pipe is at least partially disposed in said housing and wherein said angled surface is arranged and configured to extend towards said peak radiation pattern axis.

2. The device as in claim 1, wherein said light source is disposed adjacent to said at least one light pipe.

3. The device as in claim 2, wherein said at least one light pipe extends along a longitudinal axis that is substantially parallel to said axis of said peak radiation pattern, and wherein said axis of said peak radiation pattern extends into said light pipe.

4. The device as in claim 1, wherein said peak radiation pattern axis extends in a direction substantially parallel to said front face.

5. The device as in claim 1, wherein said light pipe has a front surface and wherein said angled surface is formed as a back surface, disposed opposite said front surface, wherein said axis of said peak radiation pattern extends in a direction angled away from the front face, towards said back surface of said light pipe.

6. The device as in claim 1, wherein said angled surface is configured to reflect a predetermined amount of primary light from said light source.

7. The device as in claim 1, wherein said angled surface is adapted to further comprising a reflective surface coupled to said angled surface.

8. The device as in claim 1, wherein said light pipe is coupled to said housing such that said light pipe has at least two exposed surfaces, wherein said at least two exposed surfaces are positioned substantially perpendicular to each other.

9. The device as in claim 1, wherein said angled surface has an angle set at between one degree and 33 degrees.

10. The device as in claim 1, wherein said at least one light pipe is made from a polymer.

11. The device as in claim 10, wherein said at least one light pipe is made from polycarbonate.

12. The device as in claim 1, wherein said at least one housing is configured to be installed into a wall box.

13. The device as in claim 1, wherein said wall box is configured to be a single gang wall box.

14. The device as in claim 13 wherein the electrical device further comprises at least one of: a fault circuit, a duplex receptacle, a light, a switch, an occupancy sensor.

15. The device as in claim 13, wherein the electrical device comprises a fault circuit, and a duplex receptacle having at least two plug interfaces with plug contacts, wherein said fault circuit has movable contacts that are configured to be separated when a fault is discovered to remove power from said plug contacts, and wherein the electrical device has both a test button and a reset button coupled to said front face of the electrical device.

16. The device as in claim 15, wherein said at least one light pipe extends along at least ⅕ of a length of said front face of said housing.

17. The device as in claim 16, wherein said at least one light pipe has a first exposed face extending substantially parallel to said front face of said housing, and a second face extending substantially perpendicular to said front face of said housing.

18. The device as in claim 1, wherein said at least one light pipe has a front surface that is an exposed face extending substantially parallel to said front face of said at least one housing and wherein said angled surface is angled towards said front face of said housing.

19. The device as in claim 18, wherein said at least one light pipe further comprises at least one additional exposed surface extending substantially perpendicular to said front surface wherein at least a portion of said additional surface is exposed, wherein said at least one additional exposed surface has a substantially rectangular cross-section.

20. The device as in claim 19, wherein said angled surface is disposed opposite said front surface and extends substantially perpendicular to said at least one additional exposed surface.

21. The device as in claim 1, wherein the device comprises at least one circuit board disposed in said at least one housing and extending substantially parallel to said front face of said housing.

22. The device as in claim 21, further comprising at least one light pipe support disposed in said at least one housing and configured to space said at least one light pipe from said circuit board, the device further comprising at least one lead extending from said circuit board to said light source.

23. The device as in claim 22, wherein said at least one light source is an LED light having a backing extending substantially perpendicular to said circuit board, and wherein said at least one light pipe support is configured to support said at least one light source adjacent to said at least one light pipe.

24. The device as in claim 23, wherein said at least one light pipe support has at least one groove that is configured to support said at least one lead extending from said at least one light source backing to said circuit board.

25. A process for illuminating an area adjacent to an electrical device comprising:

a) selecting a light pipe material for a light pipe;

b) positioning said light pipe into a housing having a front face, said light pipe being positioned adjacent to a light source;

c) calculating at least one angle for a reflective surface of said light pipe said angle being selected based upon the refractive index of said light pipe material to provide a substantially reflective surface which is configured to reflect a substantial portion of primary light extending from said light source.

26. The process as in claim 25, wherein said light pipe has a length and a width, wherein said length of said light pipe extends along a longitudinal axis, wherein said longitudinal axis extends substantially parallel to said front face of said housing wherein said light pipe has a front face that extends substantially parallel to said front face of said housing and substantially parallel to said longitudinal axis of said light pipe, wherein said angled reflective surface is disposed opposite said front surface of said light pipe and is angled towards said front surface of said light pipe from a first position disposed farther away from said front surface of said light pipe to a second position closer to said front surface of said light pipe.

27. An electrical device comprising:

a) at least one housing having a front face;

b) at least one receptacle opening configured for receiving a plug;

c) at least one contact disposed in said housing adjacent to said at least one receptacle opening;

d) at least one shutter, slidably disposed in said housing, said shutter being disposed between said at least one receptacle opening and said at least one contact said shutter being configured to move axially within said housing; and e) at least one spring, comprising a torsion spring coupled to said shutter, said spring being configured to bias said shutter in a closed position.

28. The electrical device as in claim 27, further comprising at least one post, wherein said spring is coupled to said at least one post and to said shutter.

29. The electrical device as in claim 27, further comprising:

at least one light source disposed in said housing said light source being configured to display a light having a peak radiation pattern extending along an axis;

at least one light pipe at least partially disposed in said housing, said at least one light pipe having at least one angled surface that is angled towards said axis of said peak radiation pattern.

30. The electrical device as in claim 1, wherein said light source comprises a light coupled to a fiber optic, wherein said light source is a face on said fiber optic which is configured to emit light and which is spaced opposite said light.

31. An electrical device comprising:

a) a housing having a front face;

b) a light source disposed in said housing, wherein said light source is configured to project a peak radiation pattern along an axis;

c) a light pipe having at least one front surface and at least one back surface, wherein said light pipe is at least partially disposed in said housing and is arranged and configured to allow said peak radiation pattern axis to intersect with at least a portion of said back surface at an angle to cause a substantial portion of light emitted from said light source to be reflected back into said light pipe.

32. The device as in claim 31, wherein the substantial portion of light comprises at least 50 percent of light emitted into the light pipe.

33. An electrical device comprising:

a) a light source;

b) a light pipe comprising:

a light input surface configured to receive a primary light, the primary light having a peak radiation pattern axis and the input surface is positioned at an angle (alpha) with respect to the peak radiation pattern axis;

a light output surface positioned at a second angle (beta) with respect to the peak radiation pattern axis;

an angled surface being at least substantially reflective of the primary light output from said light source and positioned at a third angle (gamma) with respect to the peak radiation pattern axis, said third angle (gamma) being an acute angle such that the primary light would intersect the angled surface and be reflected towards the output surface.

34. The device as in claim 33, wherein the angle alpha is substantially 90 degrees.

35. The device as in claim 33, where the angle beta is substantially 0 degrees.

36. The device as in claim 33, wherein said angle gamma is greater than 1 degree.

37. The device as in claim 33, further comprising:

an optical transmission medium having an output surface positioned adjacent to, said light input surface of said light pipe, said optical transmission medium being arranged to conduct light from said light source to said light pipe.

38. The device as in claim 37, wherein said optical transmission medium is an optical fiber.

39. The device as in claim 27, further comprising at least one post, wherein said at least one torsion spring coupled to said at least one post.

40. The device as in claim 39, wherein said torsion spring has a coil wrapped around said post.

41. The device as in claim 1, further comprising at least one sensor comprising an ambient light sensor disposed within said housing.

42. The device as in claim 41, wherein said ambient light sensor is a photodiode configured to selectively turn on or off said light source depending on an amount of ambient light.

* * * * *